(12) United States Patent
Corea et al.

(10) Patent No.: US 11,500,048 B2
(45) Date of Patent: Nov. 15, 2022

(54) FLEXIBLE RESONANT TRAP CIRCUIT

(71) Applicant: Inkspace Imaging, Inc., Pleasanton, CA (US)

(72) Inventors: Joseph Russell Corea, Berkeley, CA (US); Gillian Gentry Haemer, Oakland, CA (US)

(73) Assignee: Inkspace Imaging, Inc., Pleasanton, CA (US)

( * ) Notice: Subject to any disclaimer, the term of this patent is extended or adjusted under 35 U.S.C. 154(b) by 326 days.

(21) Appl. No.: 16/685,920

(22) Filed: Nov. 15, 2019

(65) Prior Publication Data

US 2020/0233048 A1    Jul. 23, 2020

Related U.S. Application Data

(60) Provisional application No. 62/796,019, filed on Jan. 23, 2019.

(51) Int. Cl.
| | |
|---|---|
| *G01R 33/36* | (2006.01) |
| *H03H 1/00* | (2006.01) |
| *H05K 1/02* | (2006.01) |
| *H03H 7/01* | (2006.01) |
| *H03H 3/00* | (2006.01) |

(Continued)

(52) U.S. Cl.
CPC ... *G01R 33/3685* (2013.01); *G01R 33/34084* (2013.01); *H03H 1/00* (2013.01); *H03H 3/00* (2013.01); *H03H 7/0123* (2013.01); *H05K 1/028* (2013.01); *H05K 1/0242* (2013.01); *H05K 1/0245* (2013.01); *H05K 3/103* (2013.01); *H03H 2001/0042* (2013.01);

(Continued)

(58) Field of Classification Search
CPC .......... G01R 33/3685; G01R 33/34084; G01R 33/3415; H03H 1/00; H03H 3/00; H03H 7/0123; H03H 2001/0042; H03H 2001/0078; H03H 2001/0085; H05K 1/0242; H05K 1/0245; H05K 1/028; H05K 3/103; H05K 2201/09809; H05K 3/46
See application file for complete search history.

(56) References Cited

U.S. PATENT DOCUMENTS

| | | | |
|---|---|---|---|
| 4,682,125 | A | 7/1987 | Harrison et al. |
| 6,664,465 | B2 | 12/2003 | Seeber |

(Continued)

FOREIGN PATENT DOCUMENTS

| | | |
|---|---|---|
| CN | 113766947 A | 12/2021 |
| EP | 3933426 A1 * | 1/2022 |

(Continued)

OTHER PUBLICATIONS

"International Application Serial No. PCT US2020 014629, Invitation to Pay Additional Fees dated Apr. 3, 2020", 2 pgs.

(Continued)

*Primary Examiner* — G. M. A Hyder
(74) *Attorney, Agent, or Firm* — Schwegman Lundberg & Woessner, P.A.

(57) ABSTRACT

A flexible resonant trap circuit is provided that includes a transmission line arranged to include a helical winding that has a first helical winding segment and a second helical winding segment; and a capacitor coupled between the first and second helical winding segments.

106 Claims, 12 Drawing Sheets
(6 of 12 Drawing Sheet(s) Filed in Color)

(51) Int. Cl.
  *G01R 33/34* (2006.01)
  *H05K 3/10* (2006.01)
(52) U.S. Cl.
  CPC ............ *H03H 2001/0078* (2013.01); *H03H 2001/0085* (2013.01); *H05K 2201/09809* (2013.01)

(56) References Cited

U.S. PATENT DOCUMENTS

| | | | |
|---|---|---|---|
| 7,973,614 B2 | 7/2011 | Taracila et al. | |
| 2006/0290448 A1 | 12/2006 | Wynn et al. | |
| 2010/0253348 A1* | 10/2010 | Wiggins | G01R 33/34046 324/318 |
| 2012/0172233 A1 | 7/2012 | Uchaykin | |
| 2013/0073021 A1 | 3/2013 | Halperin et al. | |
| 2013/0245741 A1 | 9/2013 | Atalar et al. | |
| 2016/0220812 A1 | 8/2016 | Bottomley et al. | |
| 2017/0343628 A1 | 11/2017 | Taracila et al. | |
| 2018/0263561 A1* | 9/2018 | Jones | A61B 5/6804 |

FOREIGN PATENT DOCUMENTS

| | | |
|---|---|---|
| JP | 2022518817 A | 3/2022 |
| WO | 2020154414 | 7/2020 |

OTHER PUBLICATIONS

"International Application Serial No. PCT US2020 014629, International Search Report dated Jun. 11, 2019", 4 pgs.

"International Application Serial No. PCT US2020 014629, Written Opinion dated Jun. 11, 2019", 14 pgs.

Josepha, Corea, "Screen Printed MRI Receive Coils", Technical Report No. UCB EECS-2018-147, [Online]. Retrieved from the Internet: http: www2.eecs.berkeley.edu Pubs TechRpts 2018 EECS-2018-147.html, (Dec. 1, 2018), 120 pgs.

"International Application Serial No. PCT US2020 014629, International Preliminary Report on Patentability dated Aug. 5, 2021", 17 pgs.

* cited by examiner

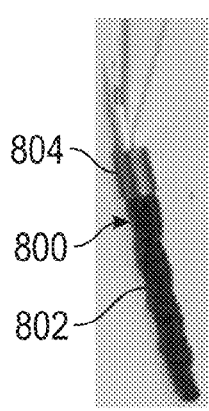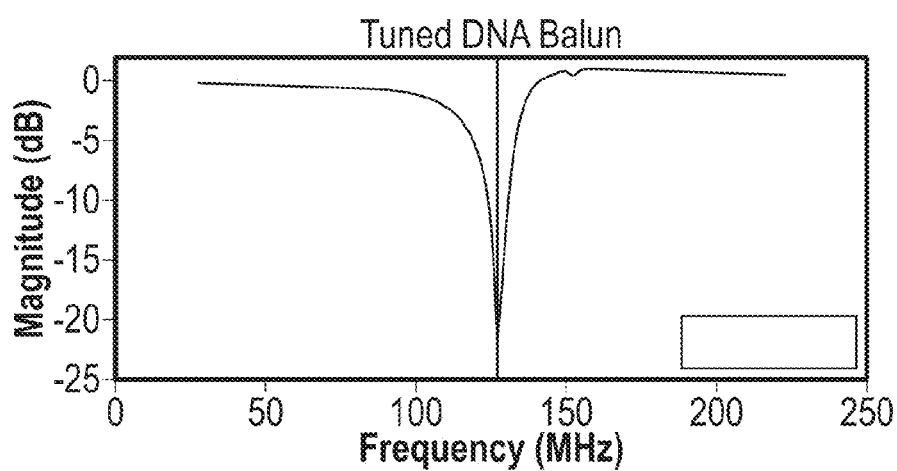
FIG. 8A  FIG. 8B
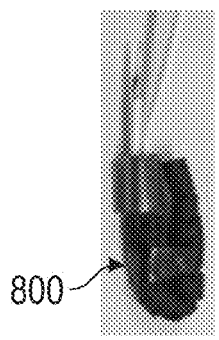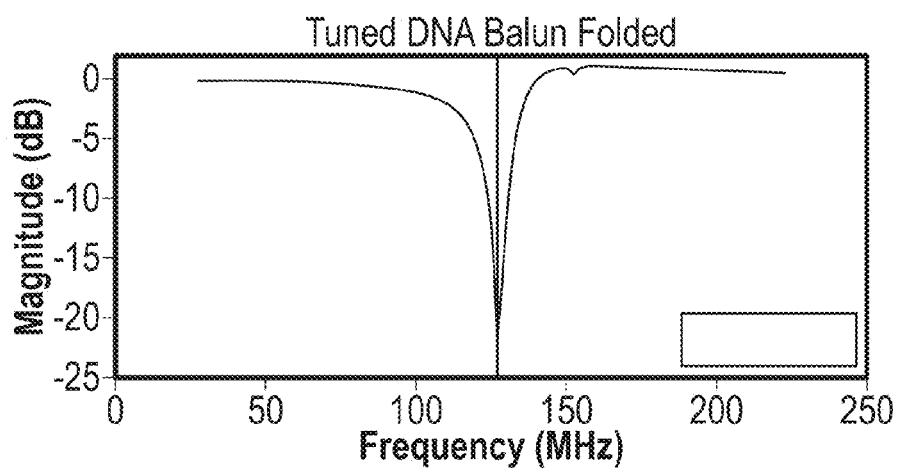
FIG. 9A  FIG. 9B
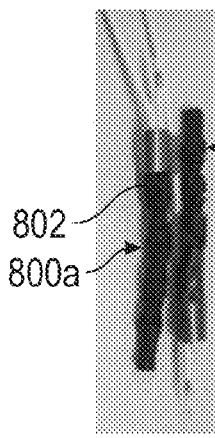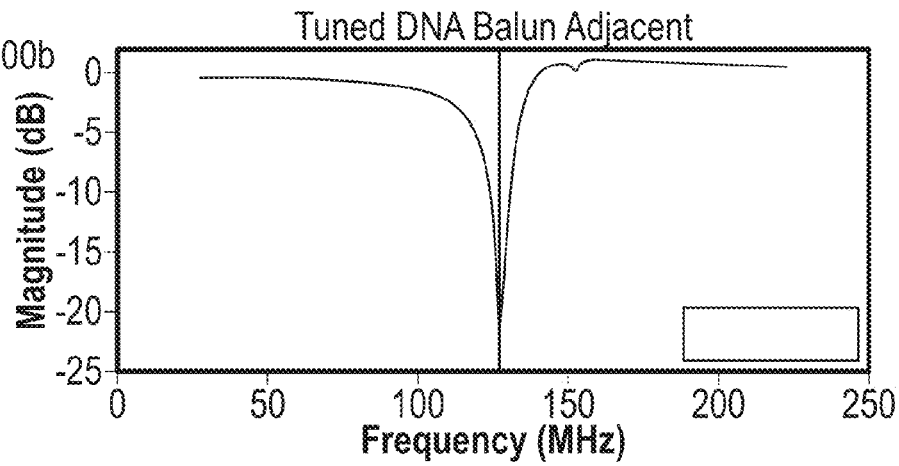
FIG. 10A  FIG. 10B

FLEXIBLE RESONANT TRAP CIRCUIT

RELATED APPLICATIONS

The present application claims the benefit of U.S. Provisional Patent Application Ser. No. 62/796,019, filed Jan. 23, 2019, entitled, "DNA Baluns"

BACKGROUND

Resonant Trap Circuits

A resonant trap is a functional resonant circuit that provides a high impedance at one or more specific frequencies. In a most basic sense, a resonant trap filters out currents in very narrow frequency bands. The inductance and capacitance of a trap can be determined by lumped elements, circuit board design, or cabling, for example. Together they determine a resonant frequency that is filtered by the trap $$\left(\omega \sim \frac{1}{LC}\right).$$

A resonant trap can be coupled to a single conductor to act as a radio frequency (RF) filter for a DC line, for example. A resonant trap can be coupled to other transmission lines with two or more conductors (e.g., coaxial cable, triaxial cable, planar transmission lines, etc.).

A typical resonant trap circuit includes a capacitance coupled in parallel with an inductance. Impedance of a typical resonant trap circuit becomes very high at its resonant frequency. Multiple resonances can be obtained by adding more inductors and capacitors to this circuit. Resonant trap circuits are used in a wide range of RF applications. For instance, in some applications, a resonant trap is used to block a signal at the resonant trap's resonant frequency from reaching a load. In a radio tuner application, for example, a resonant trap can have a variable capacitor that can be used to tune a radio receiver to select one out of multiple broadcast stations. In an antenna application, for example, a resonant trap circuit can be used to isolate one part of an antenna from another. In an MRI application, for example, a resonant trap circuit can be used in a magnetic resonance imaging (MRI) system to prevent an RF excitation signal, which is used to deposit energy into a subject/structure, from coupling to various transmission lines and cables in the system. Transmission lines are used in MRI to pass signals from receive antennae/coils to the MRI system. These signals are released from the subject/structure and are used to create images. Other cables in the MRI system carry digital and analog control signals, or power, from various peripherals to the system.

Resonant Trap Circuits in MRI Systems

Magnetic resonance imaging (MRI) utilizes nuclear spins of an atomic nuclei of interest. Typically the nuclear spins of hydrogen in water molecules are used to image the human body. During MRI, the atomic nuclei are polarized using a strong, uniform static magnetic field, referred to as $B_0$. The magnetically polarized nuclear spins generate magnetic moments in the human body. In the steady state, the magnetic moments are aligned parallel to the direction of the static magnetic field, $B_0$, and produce no useful information. In order to acquire an image, the magnetic moments are disturbed out of steady state by an excitation signal. During excitation, RF transmission coils generate an excitation magnetic field, referred to as $B_1$, that is aligned perpendicular to the static magnetic field $B_0$, and oscillates at a frequency that closely matches the natural precession of the nuclear spins. This precession frequency, the Larmor frequency of protons in the $B_0$ field, allows the excitation signal $B_1$ to deposit energy into the nuclear spin system, causing a change in net rotation of the magnetic moments away from alignment with the static magnetic field $B_0$. The effectiveness of the $B_1$ field is determined by both the precessional frequency and the magnitude and duration of the pulse. In MRI, the Larmor or precessional frequency, refers to the rate of precession of the magnetic moment of a proton around an external magnetic field. The frequency of precession is defined by the strength of the magnetic field, $B_0$, and the atomic nucleii of interest. The magnitude and duration of the RF pulse determine how far the magnetization will tilt or flip, which is commonly referred to as the flip angle. During receive mode, an RF receive coil tuned to the Larmor frequency detects the precessing magnetization as it returns back to steady state. The precessing magnetization induces electric current in the receive coil via electromagnetic induction. This induced current is an MR signal and represents the mixture of the magnetizations from all tissue within the field of view (FOV) of the receive coil. In general, the transmit RF coil can be used as a receive RF coil, or alternatively, the receive RF coil can be an independent receive-only RF coil.

The magnitude of energy transmitted by the transmit RF coil is far greater than the magnitude of the energy of the induced current within an RF receive coil. Without intervention a receive coil that is positioned close to a patient's body can couple strongly to the $B_1$ field during excitation, which creates a risk of damage to the receive coil, and a potential for patient harm from resultant strong local fields. Transmission lines, used to transmit excitation pulses to a transmit coil or an MR signal from a receive coil, can exhibit antenna-like behavior inside the system. In general, any conductive wire or cable, such as those used to carry power or digital/analog signals will exhibit similar behavior. Similar to a resonant receive coil, this can result in coupling between the transmission line and the field. Any coupling of a transmission line or a receive coil to the $B_1$ field can cause non-uniformity of the transmit flip angle. A non-uniform flip angle will degrade the information content within an induced MR signal and can be used as an indication of potential safety issues. To prevent unwanted antenna-like behavior that could degrade information content, resonant traps often are coupled to the receive coils and to transmission lines used to carry an induced MR signal.

In MRI, it is desirable for the excitation and reception to be spatially uniform in the imaging volume for better image uniformity. During excitation in a typical MRI system, excitation field homogeneity often is obtained by using a whole-body volume RF coil for transmission. This whole-body transmit coil is generally the largest RF coil in the system and is used to create a uniform $B_1$ field. A large coil, however, produces lower signal-to-noise ratio (SNR) if it is also used for reception, mainly because of its greater distance from the tissues being imaged. Therefore, smaller-sized special-purpose receive coils, that can be easily positioned closer to a patient's body, are often used for reception to enhance the SNR from a smaller volume of interest. In practice, a well-designed specialty RF receive coil is mechanically structured to both fit as close to the volume of interest as possible, and to help facilitate patient handling and comfort.

There is an industry need for flexible, form fitting, comfortable RF receive coils. In order for these coils to be safe, there is a corresponding need for a compact frequency trap circuit to prevent coupling between the $B_1$ field and the transmission lines or inductive elements of the receive coils, that is mechanically structured to facilitate patient handling and comfort. More particularly, there is a need for frequency trap circuits that are mechanically flexible enough to be compliant with spaces adjacent to a patient's anatomy, so that they can be located close to compact receive coils positioned close to a patient's anatomy. Flexible and comfortable frequency trap circuits are most useful if they can be bent and twisted without compromising their frequency trap behavior, therefore there is a corresponding need for these circuits to not be compromised by arbitrary changes to bending or positioning, for example while positioning close-by to a patient for MRI imaging.

SUMMARY

In one aspect, a resonant trap circuit is provided that includes a conductor line arranged to include a helical winding portion that includes a first helical winding segment and a second helical winding segment that are helically twisted together. A capacitor is arranged to provide capacitance between the first helical winding segment and the second helical winding segment.

In another aspect, a resonant trap circuit is applied to a magnetic resonance imaging system. Conductive lines, used to deliver analog or digital control signals and analog image information, are placed within a magnetic field used to excite atomic nuclei in a subject of interest. Resonant trap circuitry, electrically coupled to these conductive lines, prevents them from coupling to the transmitted magnetic field.

In another aspect, a receive circuit is provided for use in a magnetic resonance imaging system. The receive circuit includes a receive coil, a transmission line coupled to the receive coil and resonant trap circuit. The resonant trap circuit that includes a portion of the transmission line arranged to include a helical winding portion and includes a capacitor arranged to provide capacitance across a portion of the helical winding portion.

In another aspect, a receive array pad is provided for use in a magnetic resonance imaging system. The receive circuit includes a plurality of receive coils arranged so that each receive coil overlays at least a portion of another receive coil and includes a plurality of transmission lines each coupled to a different receive coil. Each respective transmission line is arranged to provide a respective resonant trap circuit. Each respective resonant trap circuit includes a respective portion of the respective transmission line arranged to include a respective helical winding portion and includes a respective capacitor arranged to provide capacitance across a portion of the respective helical winding portion.

In another aspect a method is provided to produce a resonant trap circuit. The method includes twisting a portion of a transmission line to form a helical winding portion that includes a first helical winding segment and a second helical winding segment that are helically twisted together and that includes a folded portion at a junction of the first helical winding segment and the second helical winding segment. The method further includes coupling a capacitor between the first helical winding segment and the second helical winding segment.

BRIEF DESCRIPTION OF DRAWINGS

The patent or application file contains at least one drawing executed in color. Copies of this patent or patent application publication with color drawing(s) will be provided by the Office upon request and payment of the necessary fee.

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. In addition, the present disclosure may repeat reference numerals and/or letters in the various examples. This repetition is for simplicity and clarity and does not in itself dictate a relationship between the various embodiments and/or configurations discussed.

FIG. 8A is an illustrative drawing showing an example resonant trap extending in a generally linear arrangement.

FIG. 8B is an illustrative drawing showing a corresponding example frequency attenuation response of the resonant trap of FIG. 8A.

FIG. 9A is an illustrative drawing showing the example resonant trap of FIG. 8A with the helical winding bent at an angle of about one-hundred and eighty degrees at about midway along the length of its helical winding portion.

FIG. 9B is an illustrative drawing showing a corresponding example frequency attenuation response of the folded resonant trap of FIG. 9A.

FIG. 10A is an illustrative drawing showing two example resonant traps each identical to the resonant trap of FIG. 8A arranged side-by-side.

FIG. 10B is an illustrative drawing showing an example frequency attenuation for the side-by-side traps of FIG. 10A.

DETAILED DESCRIPTION

Figure 1A:
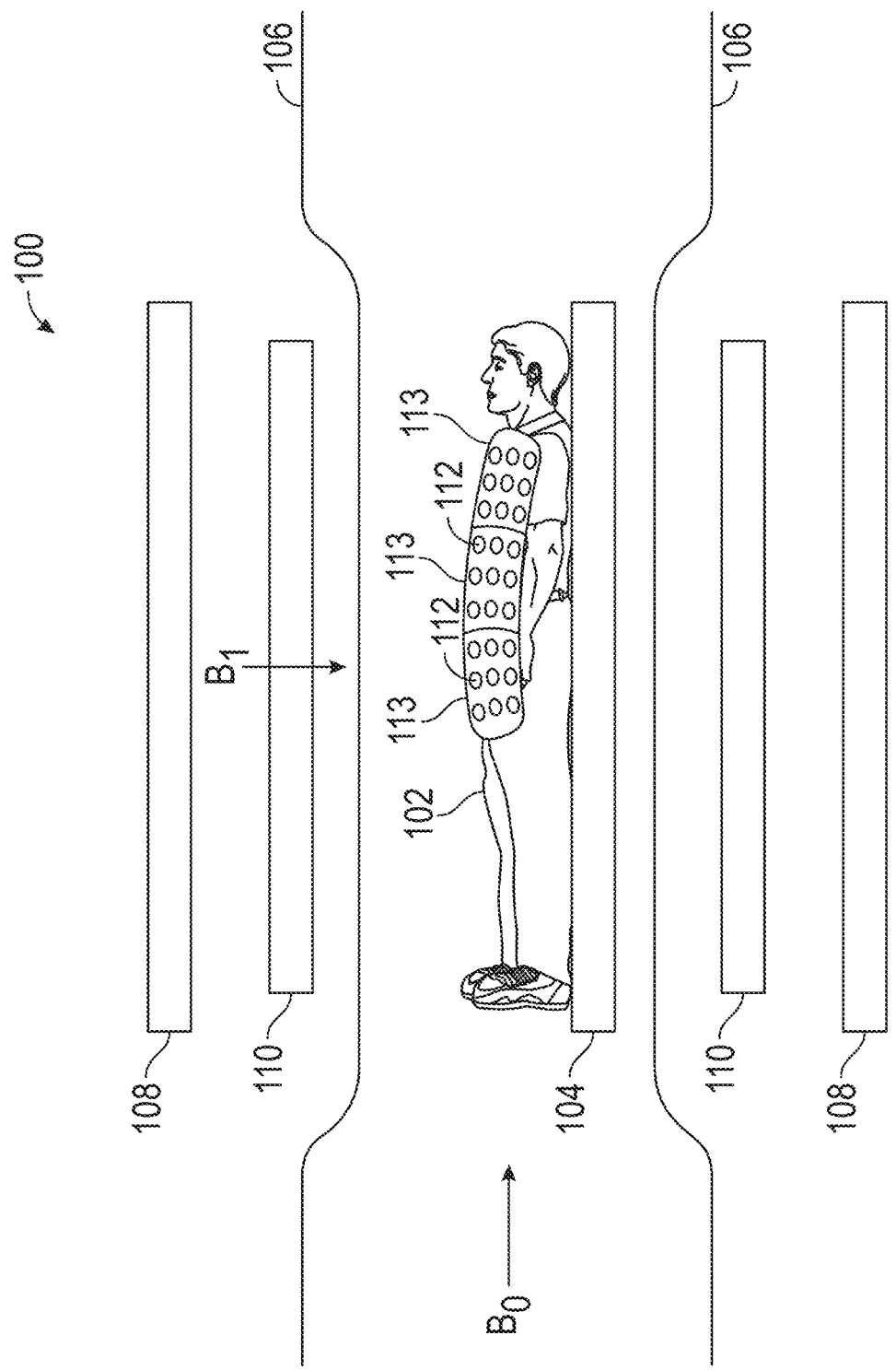
FIG. 1A is an illustrative drawing showing an RF transmit coil and an RF receive coil positioned in relation to a patient within an MRI system.

FIG. 1A is an illustrative drawing showing a RF transmit coils 110 and a RF receive coils 112 arranged in receiver array pads 113 in relation to a patient within an MRI system 100. A subject patient 102 is shown laying on a platform 104 within an MRI chamber 106. A main magnet 108 is arranged to produce a static $B_0$ magnetic field. During excitation mode, one or more transmit coils 110 transmit an excitation magnetic field pulse that produces a $B_1$ magnetic field perpendicular to the static $B_0$ magnetic field at the frequency of interest. Multiple receive coils 112 are located in close proximity to the patient's body. Changes in magnetic flux produced by precession of net nuclear magnetization within the subject, following RF-excitation, induces an MR current within the receive coils 112 that can he post-processed to extract frequency, phase, and amplitude information used to construct an MR image. As explained below, safety considerations generally require at least a minimum spacing, typically about 5 millimeters, between patient anatomy and the receive coils 112 and associated electronics.

Figure 1B:
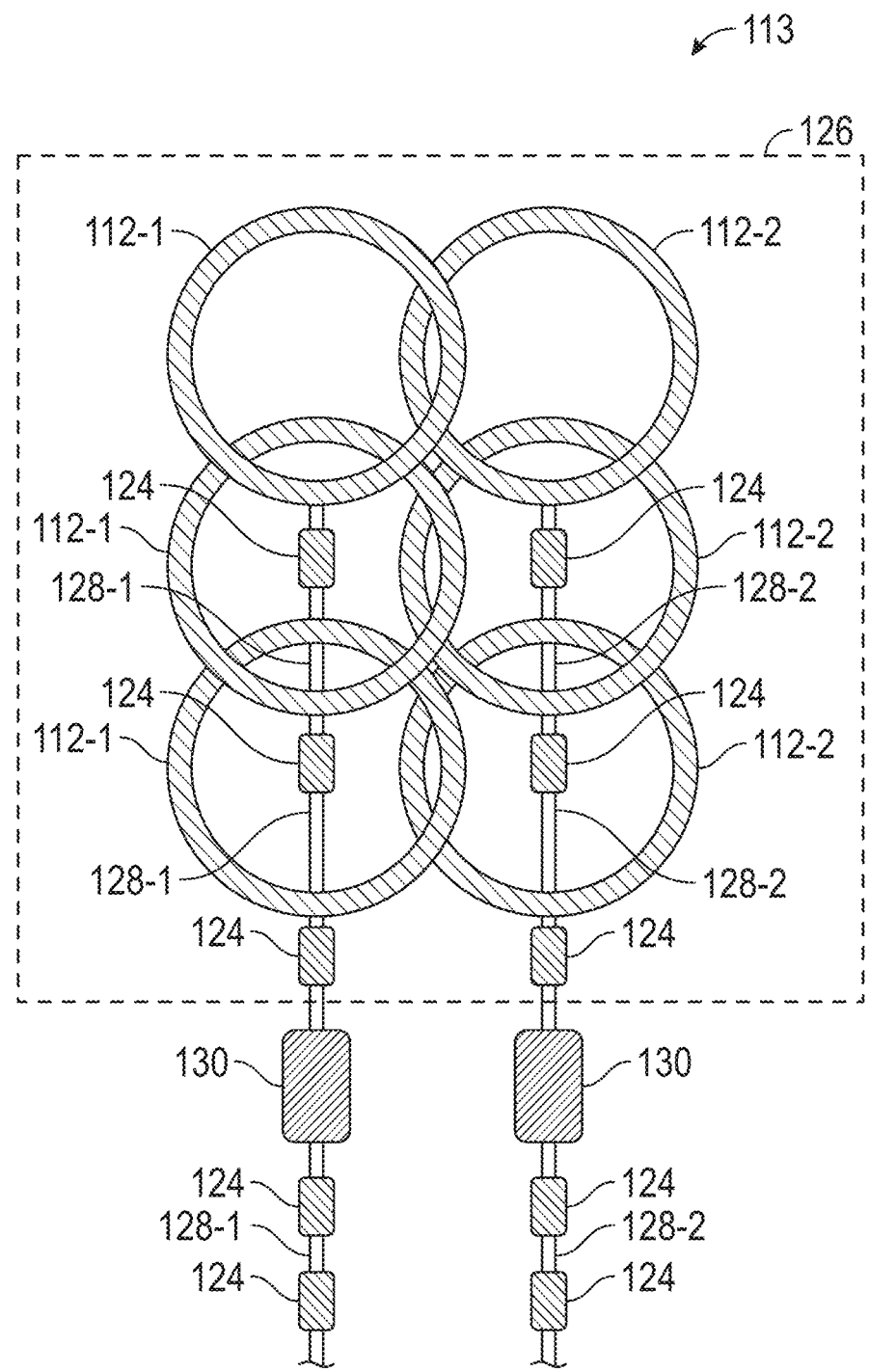
FIG. 1B is a partially transparent top view of an example array pad that includes an array of receive coils that are coupled to transmission lines containing resonant traps.

FIG. 1B is a partially transparent top view of an example receive coil array pad 113 that includes an array of receive coils 112 that are coupled to resonant traps 124. The array of coils 112-1, 112-2 can be placed within a flexible housing 126, indicated by dashed lines, that can be formed of a soft cushioning material such as fabric or foam for comfort when placed upon a patient's body and to space apart the coils and related electrical circuit components from the patient. The receive coils 112 are formed of a flexible conductive material such as flexible wire, for example or conductive foil, for example. First and second transmission lines 128-1, 128-2 extend between the receive coil array pad 113 and the Mill system 100. An example first set of three first receive coils 112-1 are electrically coupled to the first transmission line 128-1 with one of the three first coils 112-1 located between the other two of the first coils 112-1 and with each of the three first coils 112-1 partially overlapping, e.g., by 20-25 per cent, an adjacent one of the other two of the first coils 112-1. Similarly, an example second set of three second receive coils 112-2 are electrically coupled to the second transmission line 128-2 with one of the three second coils 112-2 located between the other two of the second coils 112-2 and with each of the three second coils 112-2 partially overlapping, e.g., by 20-25 per cent, an adjacent one of the other two of the first coils 112-2. The example first and second sets of receive coils are located side-by-side with each coil of each set overlapping at least one coil of the other set, but in practice can also be placed spaced apart or overlapped and offset.

Multiple array pads 113 can be placed at different locations of a patent's anatomy to capture magnetic flux produced during precession. This captured flux is transmitted back to the MRI system 100 through transmission lines 128-1, 128-2 for reconstruction, to create an image. The transmission lines 128-1, 128-2, which are flexible, and which are respectively coupled to respective receive coils 112-1, 112-2, transmit the MR current induced in the coils 112-1, 112-2 during precession back to the MRI system. The drawing of FIG. 1B depicts multiple transmission lines 128-1, 128-2 bundled together as closely to save space. In the example array pad 113, transmission lines 128-1, 128-2 are bundled in a group of three, one transmission line coupled to each circular coil element. Individual or bundled transmission lines 128-1, 128-2 have the potential to exhibit antenna-like behavior. A respective resonant trap 124 is coupled at the output of each coil 112-1, 112-2 and at intervals along the individual transmission lines 128-1, 128-2 no more than one-quarter wavelength apart, at the $B_1$ signal excitation frequency. The resonant frequency of each trap 124 matches the excitation frequency. Pre-amplifier circuits 130 are shown coupled to the transmission line between a pair of resonant trap circuits 124 but can be positioned at any point along the transmission line.

Thus, it will be appreciated that the receive coil array pad 113 can be compliant and form fitting to a patient's anatomy. The receive coils 112-1, 112-2 are formed of a flexible material. The transmission lines 128-1, 128-2 are flexible, and the resonant trap circuits 124 are formed through arrangement of segments of the transmission lines 128-1, 128-2. Thus, flexibility and thickness of the resonant trap circuits 124 is proportional to flexibility and thickness of the transmission lines 128-1, 128-2. Finally, the receive coils 112-1, 112-2, transmission lines 128-1, 128-2 and resonant trap circuits 124 are housed within a flexible housing 126 formed to a soft foam material.

Figure 2:
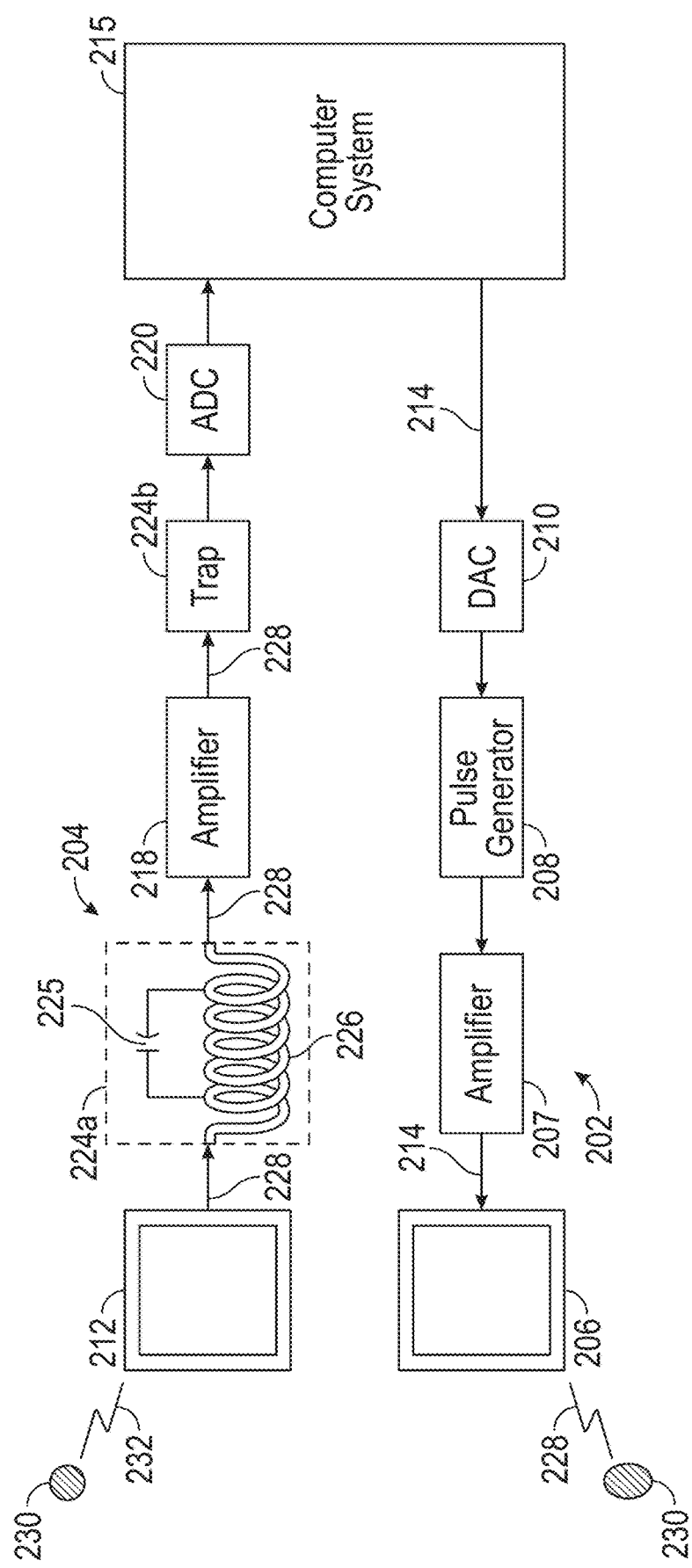
FIG. 2 is an illustrative schematic diagram showing an example transmit circuit and an example receive circuit.

FIG. 2 is an illustrative schematic diagram showing an example MRI system transmit circuit 202 and an example MRI system receive circuit 204. The example transmit circuit 202 includes a transmit coil 206, an RF power amplifier 207 a pulse generation circuit 208, a digital-to-analog converter (DAC) 210 circuit and a computer system 215. An excitation signal transmission line 214 couples the amplifier 207 and the pulse generation circuit 208 to the transmit coil 206. The example receive circuit 204 includes a receive coil 212, an RF power amplifier circuit 218, an analog-to-digital converter (ADC) circuit 220 and the computer system 215. A receive signal transmission line 228 couples the receive coil 212 to the amplifier circuit 218. The receive circuit 204 also includes first and second example resonant traps 224a, 224b, sometimes referred to as baluns, coupled to the receive transmission line 228. As shown within dashed lines with reference to resonant trap 224a, each of the first and second resonant traps 224a, 224b includes a parallel combination of a capacitor 225 and an inductor 226 coupled between portions of the receive transmission line 228. It will be understood that resonant trap 224b includes a similar arrangement of capacitor and inductor (not shown). A first resonant trap 224a is located to couple to a portion of the receive transmission line 228 adjacent to the receive coil 212. The example first resonant trap 224a is typically placed as close as possible to the receive coil mechanically. The example first resonant trap 224a is used to keep an inductor (not shown) of the receive coil 212 from appearing to the scanner as a part of the receive transmission line 228. The example second resonant trap 224b is shown located along the receive transmission line between the amplifier 218 and the ADC 220. In practice, for example, there can be many additional resonant traps (not shown) placed on the connections between the receive coil 212 and the amplifier 218, and between the amplifier 218 and the ADC 220. Generally, these resonant traps are placed such that the length of the receive transmission line 228 between traps is less than a quarter wavelength (relative to the scanner's resonant frequency). This prevents standing wave behavior on the transmission line. Therefore, the position of the traps is often determined by the total length of cable/transmission line 228.

It will be understood that the receive circuit 204 of FIG. 2 represents a single receive coil 212, a single transmission line 228 with corresponding resonant traps 224a, 224b and electronic components (e.g., amplifier and ADC). However, as shown in the illustrative drawings of FIGS. 1A-1B, an MRI system 100 often includes multiple receive circuits 204 arranged in an array, that each includes a separate coil and transmission line as well as corresponding resonant traps and electronics. The coils are tightly packed together in an overlapping configuration to ensure adequate coverage of precession energy and to minimize coupling between receive coils. Moreover, coil arrangement is influenced by safety standards. Thus, it will be appreciated that size and flexibility of resonant traps, which are co-located with the coils, are factors in arranging the coils for effective operation.

During excitation mode, the DAC 210 converts digital signals provided by the computer system 215 to analog signals that are provided to the pulse generator 208. The pulse generator 208 produces short excitation pulse signals at the Larmor frequency of the MRI system, which are (then amplified by an RFPA 207 and then) transmitted to patient tissue via the transmit coil 206, to cause change in net rotation of magnet moments of nuclei 230 within the tissue. During the excitation mode, the first and second resonant traps 224a, 224b, which are coupled to the receive circuit 204, absorb common mode current induced in the transmission line 228 by the excitation pulse. During the receive mode, an electric current is induced within the receive coil at the Larmor frequency due to precessing magnetization 232 of atomic nuclei 230 within the subject tissue as it relaxes back to steady state. This induced signal is passed down the transmission line 228 as a differential signal to the amplifier circuitry 218, which amplifies the induced excitation signal. A secondary portion of the transmission line 228 then carries the amplified signal to the ADC 220, where it is converted to digital form for processing at the computer system 215. All receive signals are transmitted as a differential signal. Here they are depicted to be transmitted along a transmission line 228. The first and second resonant traps 224a, 224b are coupled to not interfere with differential signal transmission during the receive mode, and to only block common mode currents.

Figure 3:
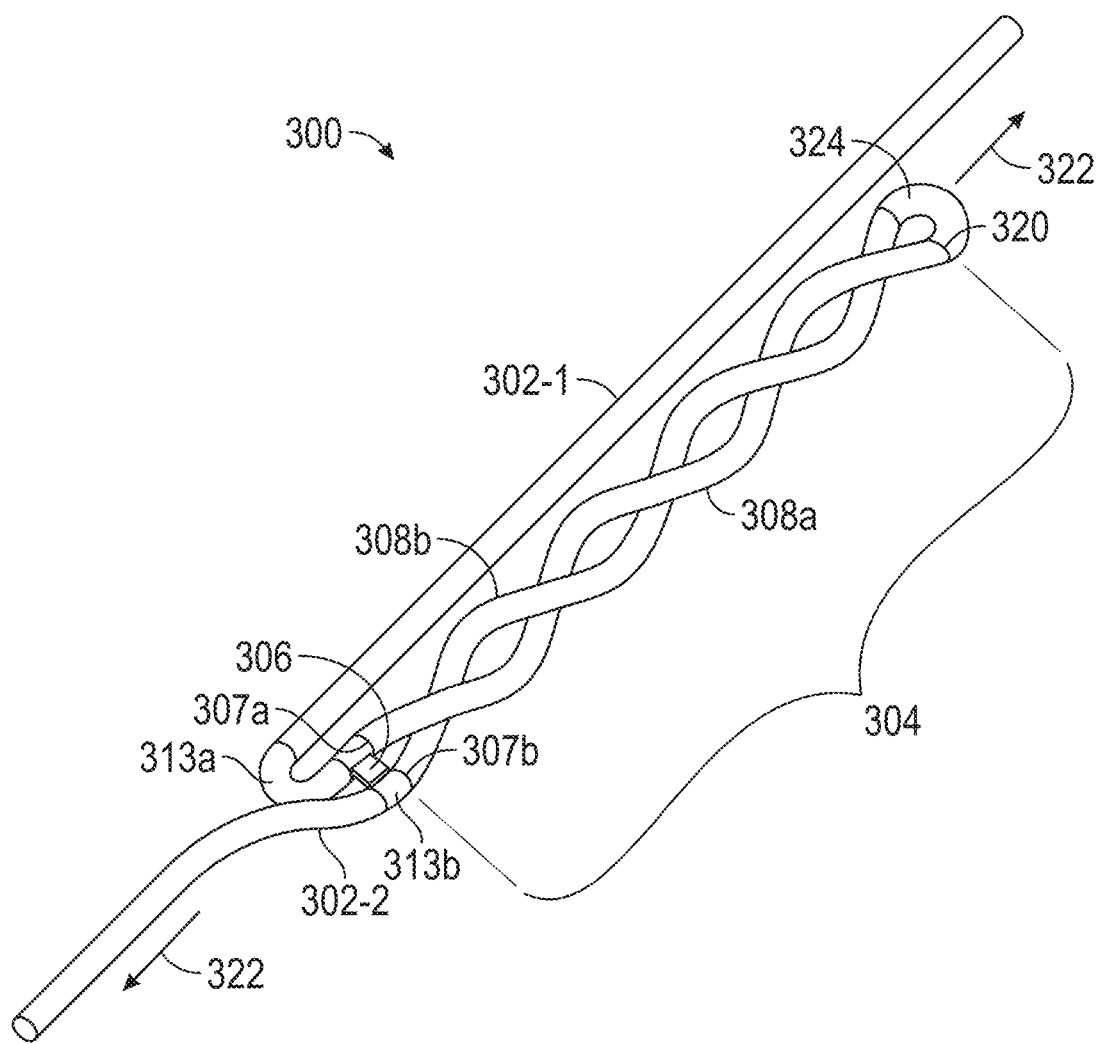
FIG. 3 is an illustrative drawing showing a perspective view of an example resonant trap circuit coupled to a transmission line.
Figure 4A:
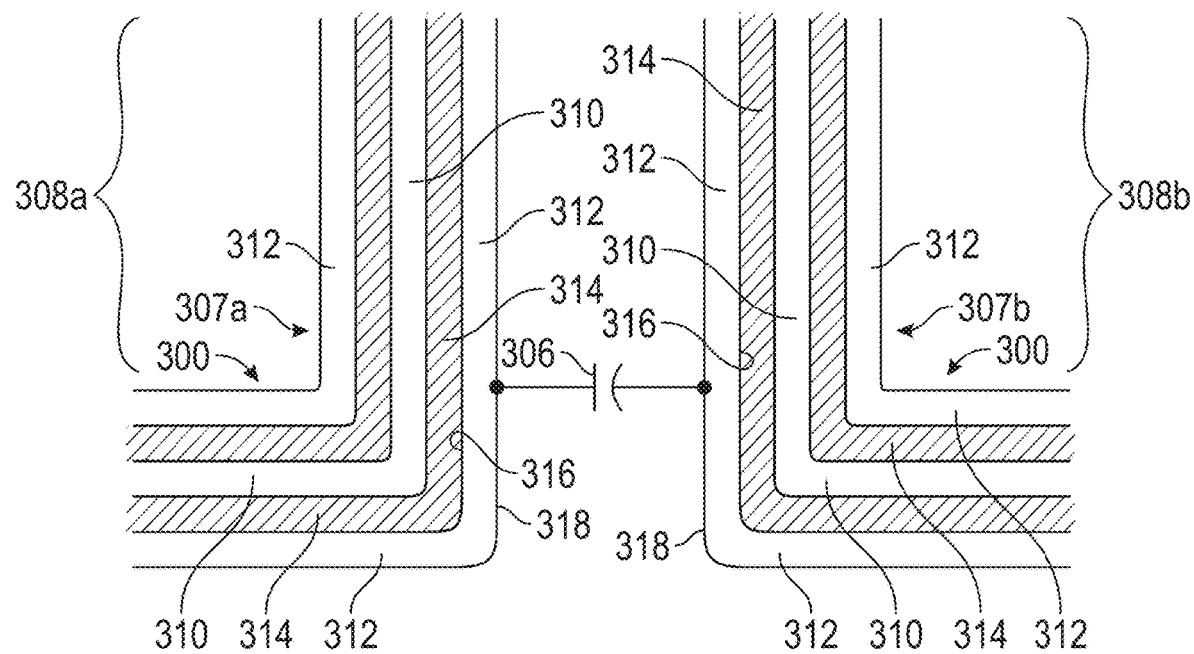
FIG. 4A is an illustrative side cross-section view of portions of first and second segments of an example coaxial transmission line of FIG. 3 coupled to a capacitor element of the resonant circuit.
Figure 4B:
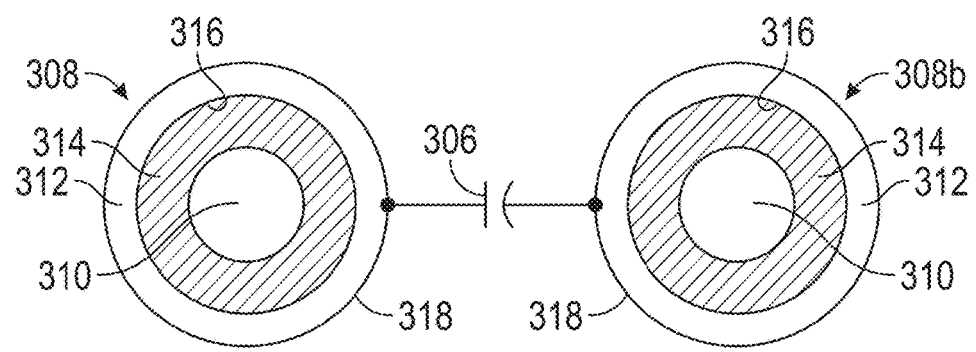
FIG. 4B is an end cross section view of the portions of the example coaxial transmission line of FIG. 3 coupled to a capacitor element of the resonant circuit.

FIG. 3 is an illustrative drawing showing a perspective view of an example resonant trap circuit 300. The example resonant trap 300 includes a portion of a receive transmission line 302 twisted to form a helical winding portion 304 to act as an inductor and includes a capacitor 306 coupled between segments of the helical winding portion 304. An example resonant trap, also referred to as a resonant tank circuit or as a balun, provides maximum resistance at a selected frequency, referred to as its resonant frequency. In an example resonant trap 300, each of the capacitance and the inductance can be adjusted to select a resonant frequency. The example resonant circuit has a resonant frequency selected to provide a maximum resistance at the Larmor frequency of an MRI system. The receive transmission line 302 is mechanically flexible, and the helical winding portion, which comprises a continuous portion of the receive transmission line 302, is similarly flexible. A portion of the transmission line that makes up the helically wound portion 304 of the resonant trap determines the flexibility of the resonant trap. The individual legs of the helical portion 304 maintain the flexibility of their original non-winded form, though radius of curvature of the overall helically wound portion 304 is limited by the radius of the total helical winding. FIG. 4A is an illustrative side cross-section view of portions of first and second segment portions of an example transmission line 302 of FIG. 3, coupled to a capacitor 306 of the resonant trap 300. FIG. 4B is an end cross section view of the portions of the example transmission line 302 of FIG. 3, coupled to the capacitor 306 of the resonant trap 300. An example transmission line 302 includes a first conductor 310 and a second conductor 312. The example transmission line of FIGS. 4A-4B includes a coaxial transmission line that includes the first conductor 310 positioned as an inner conductor of the transmission line 302 and the second conductor 312 positioned as an outer conductor of the transmission line 302. An example transmission line 302 includes a dielectric material 314 interposed between the first and second conductor lines 310, 312 to electrically isolate the first (inner) conductor 310 and the second (outer) conductor 312. An inner surface 316 and an outer surface 318 of the outer (second) conductor 312 behave as electrically separate surfaces due to the skin-effect, although they are continuous portions of the outer conductor 312. The example capacitor 306 is coupled between respective outer surface portions 318 of the second conductor line 312 at base portions 307a, 307b of opposed helical winding segments 308a, 308b of the helical winding. As explained below, the resonant trap prevents current from flowing freely at the selected frequency, e.g., at the Larmor frequency, on the outer surface of the second conductor line.

Referring again to FIG. 3, the example resonant trap 300 includes a continuous length of transmission line 302 folded over and twisted to faun the helical winding portion 304. The capacitor 306 is electrically coupled between portions of the transmission line at respective first and second base portions 307a, 307b of the helical winding 304 opposite a folded portion 320. The helical winding portion 304 includes a first helical winding segment 308a that extends between the first base portion 307a of the helical winding 304 and the folded portion 320 at an apex of the helical winding 304. The helical winding 304 includes a second helical winding segment 308b that extends between the second base portion 307b of the helical winding and the folded portion 320 at the apex of the helical winding 304. When the helical winding 304 is arranged to extend in a linear layout, a longitudinal axis 322 extends through the folded portion 320 and between the centers of the first and second helical winding segments 308a, 308b, and between the first and second base portions 307a, 307b.

The first helical winding segment 308a and the second helical winding segment 308b together have a radius of curvature that is dependent at least in part upon a radius of curvature of the transmission line 302. In an example resonant trap 300, a minimum radius of curvature of the helical winding portion 304 is twice the diameter of the transmission line 302, or the diameter of the helically wound portion as a whole as the helix is tightly wound. The helix can be less tightly wound by placing a spacer between the two legs of the helix, effectively increasing the radius of the helix. The helix can be more tightly wound by decreasing the thickness of the outer insulative layer of the transmission line. The minimum radius of curvature for this resonant trap is limited by the diameter of the helix as a whole. The maximum diameter of the helix is typically application dependent and is a function of the self-shielding property of the trap required by the application. Self shielding properties depend on how tightly the resonant trap is wound (twists per length) and how close the two legs of the twist are to each other (radius of helix). The particular application determines the level of self-shielding required.

The first and second transmission line segments 308a, 308b, which are constituents of a continuous transmission line portion, join at junction demarcated by the folded portion 320. A portion of the outer insulative layer of the transmission line 302 is stripped away to allow for fine tuning of inductance. In an example resonant trap 300, an example capacitor 306, which can be an integrated circuit capacitor or a ceramic chip capacitor for example, electrically couples the first base portion 307a of the first helical winding segment 308a and the second base portion 307b of the second helical winding segment 308b. A portion of an outer insulative layer of the transmission line 302 is also stripped away to expose opposed portions 313a, 313b of the outer surface 318 so that the capacitor 306 can be electrically coupled (e.g., soldered) between them. In an alternative example resonant trap, multiple individual capacitors (not shown) can he coupled distributed longitudinally between the first and second helical winding segments 308a, 308b. In another alternative embodiment, a single distributed capacitive element can be coupled along the length of the helical twist 304. As explained above, the first and second helical winding segments 308a, 308b each comprises a portion of a continuous transmission line 302.

Outer current, which is sometimes referred to as common mode current, flows in opposite directions within the first and second helical winding segments 308a, 308b of the helical twist 304. Common mode current can be induced in the resonant trap, for example, during excitation mode when the transmission coil transmits a high energy excitation pulse. Current flows in a first direction within the first helical winding segment 308a between the first base portion 307a and the folded portion 320. Current flows in a second direction, which is opposite to the first direction, within the second helical winding segment between the second base portion 307b and the folded portion 320. In this way current flows in either direction along a continuous pathway on the outer surface 318 of the portion of the transmission line 312 that is twisted to form the helically twisted portion 304, for example in a path from base portion 307a through the first helical winding segment 308a to folded portion 320, and then along second helical winding segment 308b to base portion 307b.

The resonant frequency of the resonant tank circuit is determined by factors that include the total length of the transmission line included in the helically twisted portion 304, approximate cross-sectional area of the helically twisted portion 304, number of turns in the helically twisted portion 304, and the value and position of capacitance 306. Moreover, a resonant tank circuit having more than one resonant frequency can be produced by providing different capacitors across different regions of the helical winding portion 304. Additionally, inductance can depend upon dielectric properties associated with the transmission 302. During transmit mode, the inductance of the helical winding portion 304 in combination with capacitance of the capacitor 306 form a resonant circuit on the outer conductor surface 318 of the first and second helical winding segments 308a, 308b to create a high impedance circuit. This high impedance prevents current from flowing freely within the helical winding portion 304 along the outer surfaces of the first and second helical winding segments 308a, 308b. During receive mode, a differential current, which flows in opposing directions along the first (inner) conductor 310 of the transmission line and the along the inner surface 316 of the second. conductor 312, flows through the center of the resonant trap undisturbed due to the skin effect of currents in the second conductor 312 of the cable. In an example resonant trap 300, the first conductor 310 and the inner surface 316 of the second conductor 312 act as differential lines to conduct a differential signal. The outer surface 318 of the second conductor 312 does not host the differential current but will act as a conductive surface to host common mode currents.

While an example transmission line 302 is implemented using a coaxial cable, alternate example resonant trap circuits can include triaxial or twinaxial cable, for example. An example resonant trap circuit can include a planar transmission line, including but not limited to a stripline, a microstripline, a coplanar waveguide, a coplanar strip, a slotline, a substrate integrated waveguide, a finline, an imageline, or any multilayer variant of such, for example. An example resonant trap circuit can include a balanced line, including but not limited to a twisted pair, a shielded pair, a star quad cable, a twin-lead, a lecher line, or a parallel line or parallel wire transmission line. An example resonant trap circuit can include a metallic or dielectric waveguide, for example. Each of the above example transmission lines can be implemented in the style of one or more layers on a flexible printed circuit board, standard printed circuit board, or created using solution processing (e.g., printed electronics), for example.

Figure 5A:
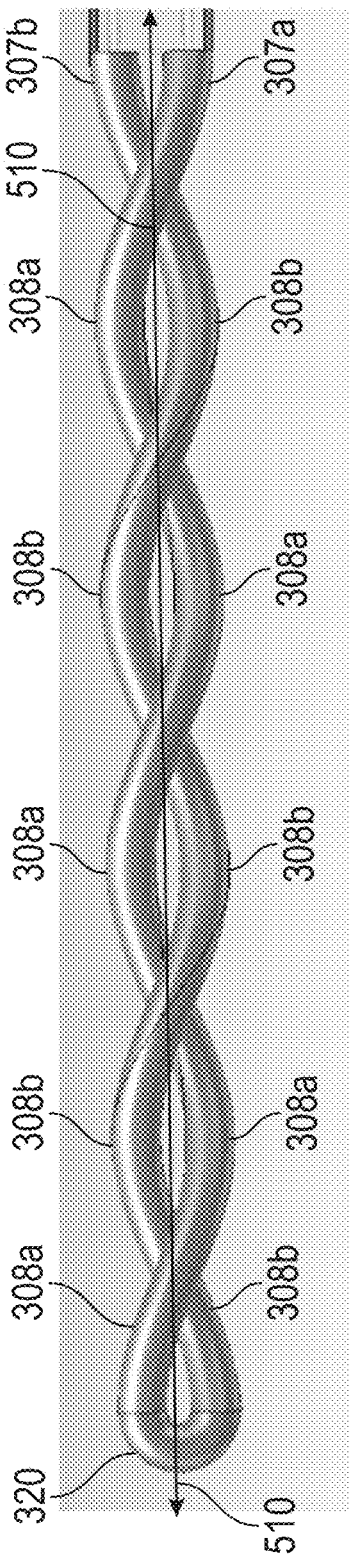
FIG. 5A is an illustrative side view of the helical winding portion of the example resonant trap of FIG. 3.
Figure 5B:
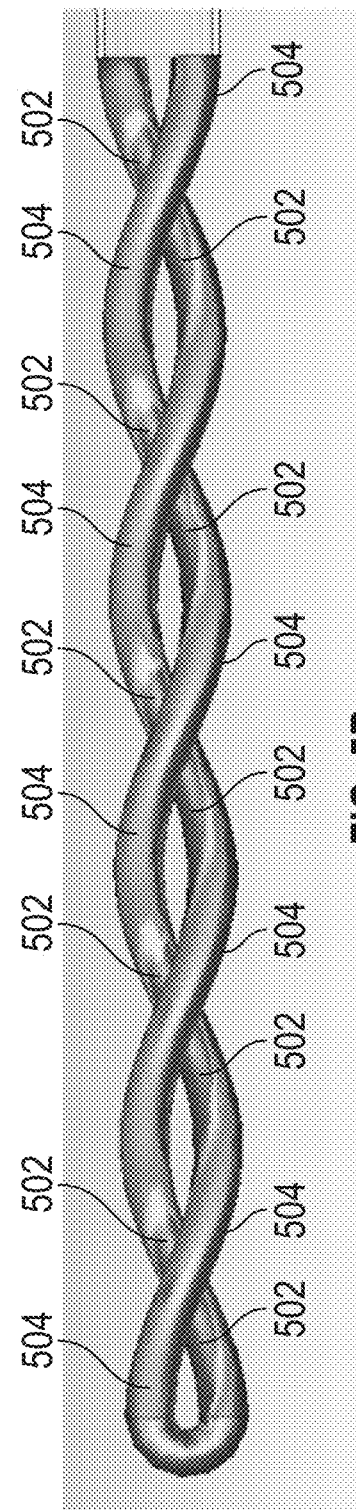
FIG. 5B is an illustrative drawing showing a map of a simulated magnetic field resulting from the outer surface current flow within the helical winding portion of the example resonant trap of FIG. 3.
Figure 5C:
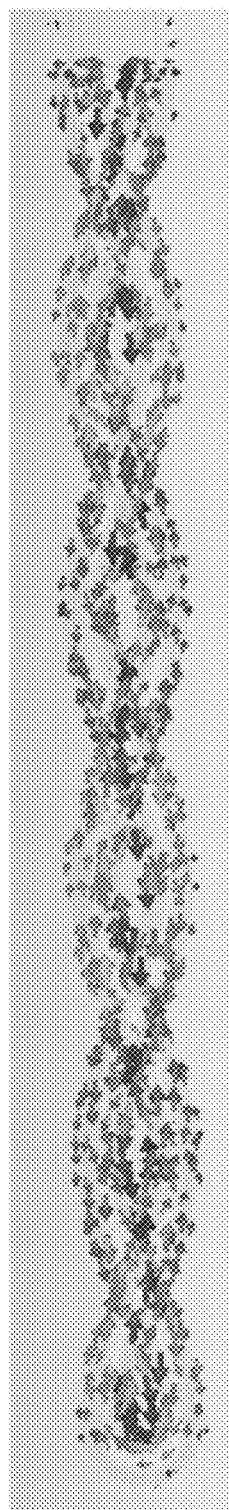
FIG. 5C is an illustrative drawing showing an example simulation of outer surface current pathways within a helical winding portion of the example resonant trap of FIG. 3.

FIG. 5A is an illustrative side view of the helical winding portion 304 of the example resonant trap 300 of FIG. 3. FIG. 5B is an illustrative drawing showing a map of a simulated magnetic field resulting from the outer surface current flow within the helical winding portion 304 of the example resonant trap 300 of FIG. 3. FIG. 5C is an illustrative drawing showing an example simulation of outer surface current pathways within a helical winding portion 304 of the example resonant trap 300 of FIG. 3.

FIG. 5A shows an axis of symmetry 510 that extends longitudinally within the helical winding portion 304 equidistant from the first winding segment 308a and the second helical winding segment 308b. FIG. 5B shows first strongest magnetic field regions 502, which are indicated in red, are located where surfaces of the opposed helical winding segments 308a, 308b face toward one another and second weakest magnetic field regions 504, which are indicated in blue, are located where the surfaces of the opposed helical winding segments 308a, 308b face away from each other. The individual arrows in FIG. 5C represent current flow directions. The size and color of the arrows represents the magnitude of the current flow. Larger size arrows represent larger magnitude current flow and vice versa. Direction of the arrows represents direction of the current flow. Red arrows represent the largest magnitude current and blue arrows represent the smallest magnitude current. Current flows in opposite directions along the opposed helical winding segments 308a, 308b. FIG. 5C shows that a larger current flows along surface portions of the opposed helical winding segments 308a, 308b that face toward one another where the magnetic field is largest; a smaller current flows along surface portions of the opposed helical winding segments 308a, 308b that face away from one another where the magnetic field is smallest.

More particularly, electromagnetic simulations of the operation of an example resonant trap circuit show that outer surface currents, such as surface currents induced by excitation pulse transmission, follow the shortest inductive path. As shown in FIG. 5C, in the case of the example helical winding 304, the shortest path between the respective first and second base portions 307a, 307b and the folded portion 320 of the helical winding 304 is the path along the inner-facing surface portions of the helically wound first and second transmission line segments. As shown in FIG. 5C, current such as common mode current flows in opposite directions along the inner-facing surfaces of the helically wound first and second helical winding segments 308a, 308b. As shown in FIG. 5B, the magnetic field resulting from common mode current flow is therefore confined to the center portions of the helical winding 304 between the facing portions of the opposed helical winding segments 308a, 308b. The resultant magnetic field from each leg 308a, 308b of the helical winding is therefore self-shielded, instead of radiating. This innate self-shielding of the helical winding 304 makes the example resonant circuit 300 more insensitive to external magnetic field and load changes and can prevent the resonant circuit 300 from radiating and generating field sensitivity issues. An optional conductive cover formed of braid, foil, or tubing, for example, can be placed over the entire resonant trap assembly to provide additional electromagnetic shielding, for example.

The example resonant trap 300 can be tuned by selecting an appropriate size capacitor 306 used to electrically couple the base portions of the first and second helical winding segments 308a, 308b. The technique of joining a capacitor 306 to the helical winding 304 generally does not affect the performance of the resonant trap circuit 300, provided that a mechanically strong and resilient electrical connection is created (e.g., solder, crimp, bond, etc). The resonant frequency of the resonant trap follows the form of $$\omega \sim \frac{1}{LC}$$

where L is the inductance of the resonant trap, dominated by the inductance of the helical twist, and C in the distributed capacitance of the circuit, including the lumped capacitor 306. For fine tuning of frequency, locations where the capacitor 306 couples to the first and second helical winding segments can be selected before bonding to adjust inductor length, since shifting the position of the capacitor shifts the length of the helix and therefore the inductance. Also, for fine tuning, a selectable amount of conductive material 324, such as solder, can be added to the folded region 320 at the apex of the helical winding to adjust inductance by altering current flow path to, in effect, adjust inductor length, for example. By way of explanation, consider, for example, that the folded region 320 is a small loop, and the addition of solder would fill in some of the area of this loop, effectively making the loop smaller, and therefore the inductance smaller. Also, for frequency tuning, the diameter of the helical winding can be adjusted to modify total inductance, by placing a spacer between the first and second helical winding segments, by varying torsion on the helical winding portion 304 to increase or decrease radius of the winding or number of turns per length, or by changing thickness of an exterior coating on the transmission line, for example. Increasing the spacing increases the radius of the helix, and therefore the area of the cross section of the helix. Increasing the radius should increase the inductance, though it does decrease some distributed capacitance along the helix, so it is slightly less linear. For tuning of frequency, the capacitance of the lumped capacitive element 306, or of distributed capacitive elements, can also be adjusted.

For use in MRI, an example resonant trap 300 can be tuned to be resonant at the Larmor frequency of the scanner. As an example, resonant tank circuits with helical inductors have been tuned for operation at 127 MHz, for operation on a 3T MRI system. Reductions in common mode current measured were between −10 and −30 dB depending on cable length, with −15 dB typical for resonant circuits with a helical winding length of approximately 3.5 cm. Thus, an example resonant traps can have a resonant frequency suitable to operate at 3 Tesla, which is approximately 127 MHz. An example resonant trap can have a resonant frequency suitable to operate at 1.5 Tesla, which is approximately 64 MHz. An example resonant trap can have a resonant frequency suitable to operate at 7 Tesla, which is approximately 300 Mhz. Presently available scanners (non-clinical) include 0.35 T to 10.5 T (14 to 450 MHz). Blocking at these frequencies for these scanners are different, and in order to produce a reasonable block the total length, radius, and number of turns in the helix would need to vary accordingly.

In an example resonant trap circuit 300 tuned for operation at 1.27 MHz, frequency blocking was measured to be between 10 dB and 30 dB. Industry standards for a cable trap are also frequency specific, generally: >15 dB of blocking at 3 T/>20 dB blocking at 1.5 T. The amount of blocking also affects $B_1$ perturbation and coil heating. Sufficient blocking should result in minimal variation of $B_1$ (FIGS. 6A-6C) and a pass of temperature testing per IEC 60601-1 and IEC 60601-2-33 guidelines.

Figure 6A:
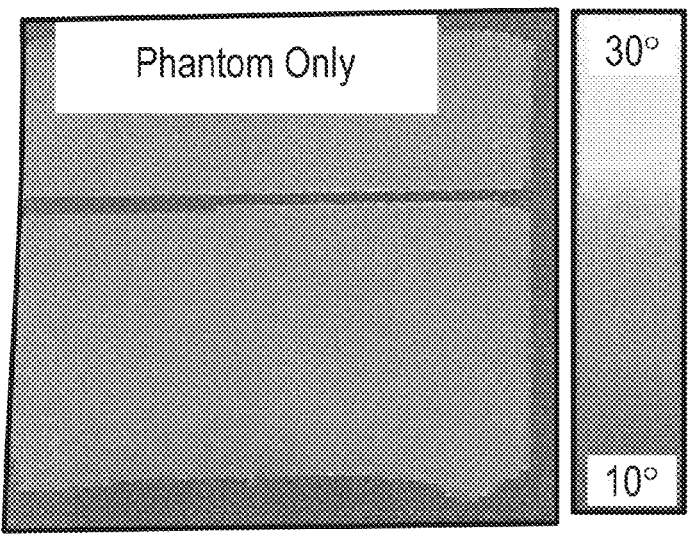
FIGS. 6A-6C are illustrative maps representing a flip angle inside an example homogenous water filled region to show the effect of the receive coils, transmission line cabling and resonant trap circuits on the $B_1$ excitation.
Figure 6B:
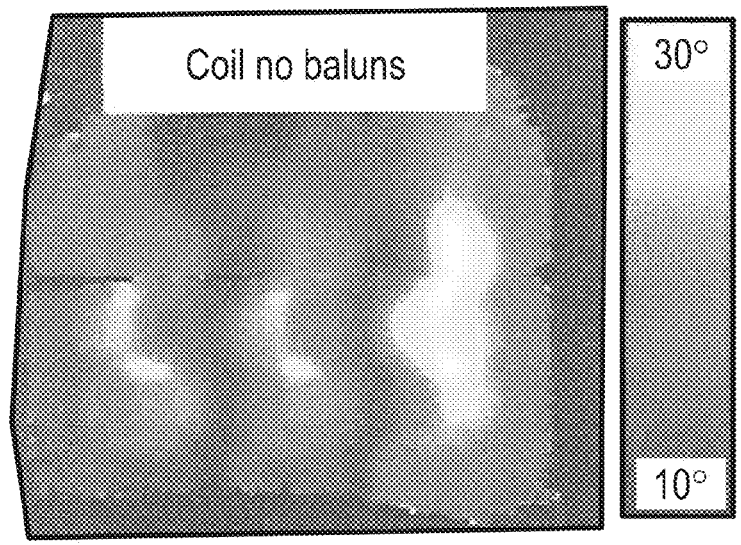
Figure 6C:
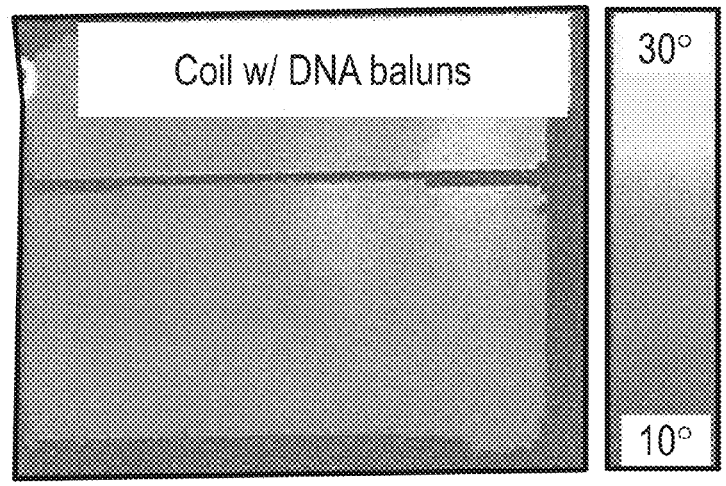

FIGS. 6A-6C are illustrative maps representing a flip angle inside an example structure made up of two homogenous water filled regions to show the effect of the receive coils, transmission line cabling and resonant traps on the $B_1$ excitation. FIG. 6A shows a baseline flip angle in a slice of the region with no receiver coil present and can be considered a 'gold standard' for performance. FIGS. 6B-6C respectively show the flip angle of the same slice just under the receive coil with no resonant trap coupled to the receive coil array (FIG. 6B) and with resonant traps coupled to the receive coil array (FIG. 6C). The map produced when the coil had no resonant trap on it (FIG. 6B) has large flip angle deviations from the baseline (FIG. 6A) while the map from a receive coil with a resonant trap (FIG. 6C) is more like the baseline map (FIG. 6A). Thus, absence of a resonant trap to absorb excitation energy at the receive coil and/or along the receive transmission line increases likelihood of non-uniform B₁ flip angles, which can degrade MRI results. Significant deviations in $B_1$ are also considered a safety concern in MRI, as local variations in $B_1$ are often seen in tandem with local variations in SAR. The maps show that a resonant trap can provide a high impedance block to absorb excitation energy and prevent a receive coil and the transmission line from interfering with the $B_1$ excitation.

Figure 7A:
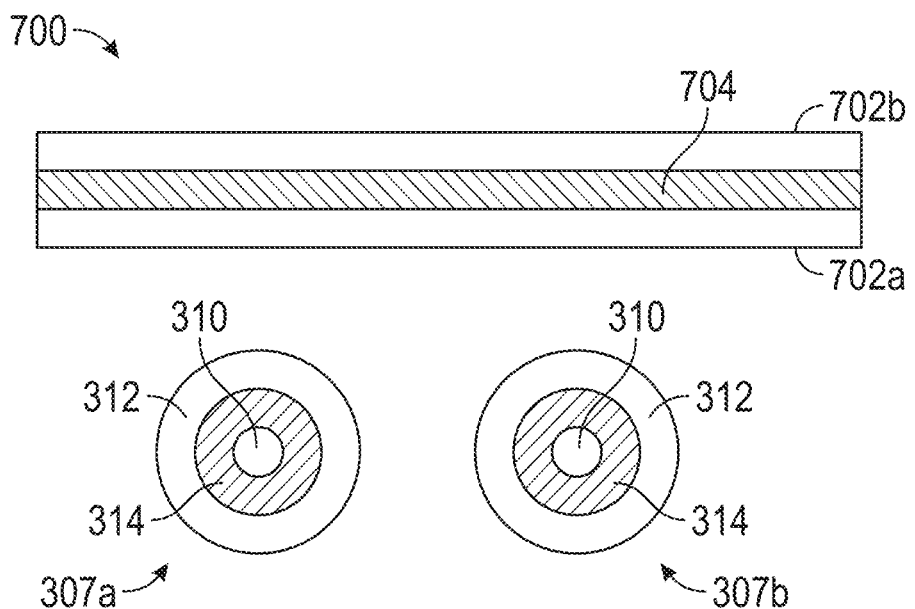
FIG. 7A is an illustrative drawing that shows an unassembled arrangement including a flexible capacitance sheet and a cross-section end-view of base portions of the first and second segments of the helical winding.
Figure 7B:
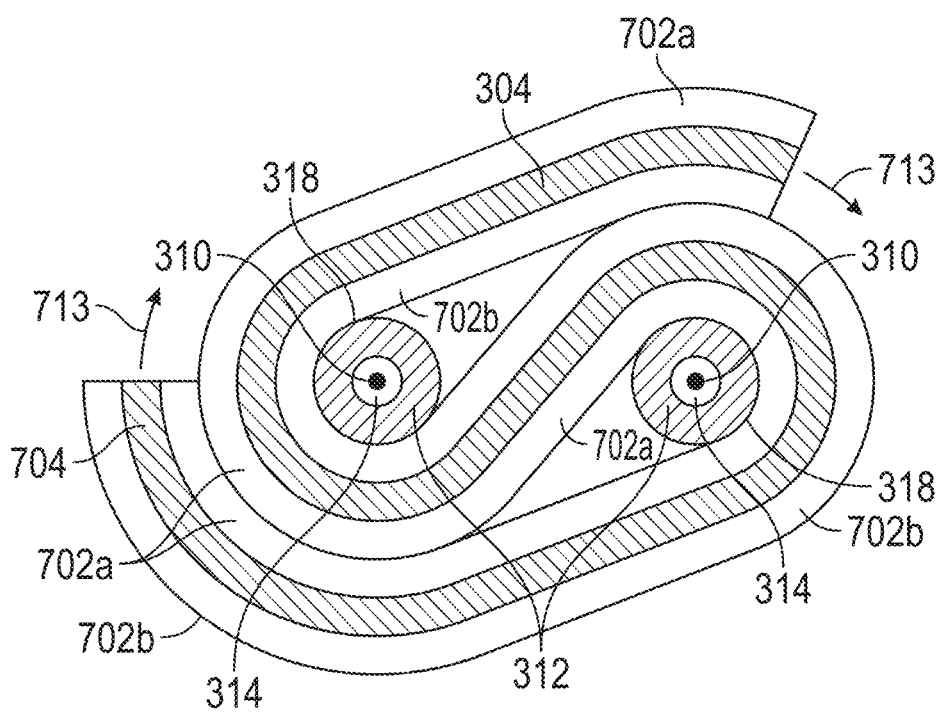
FIG. 7B is an illustrative drawing that shows the flexible capacitance sheet of FIG. 7A with a first conductor plate rolled into contact with a base portion of the first segment and with a second conductor plate rolled into contact with a base portion of the second segment.

FIGS. 7A-7B are illustrative drawings to show an alternative example flexible capacitor 700 that includes a first and second flexible conductive plates 702a, 702b separated by a flexible dielectric 704. FIG. 7A is an illustrative drawing that shows an unassembled arrangement including a flexible capacitance layer 700 and cross-section end-views of respective first and second base portions 307a, 307b of the first and second segments of the helical winding. FIG. 7B is an illustrative drawing that shows the flexible capacitance layer 700 of FIG. 7A with the first conductor 702a rolled into contact with the first base portion 307b and with a second conductor 702b rolled into contact with the second base portion 307a. More specifically, FIG. 7B is an illustrative drawing that shows the flexible capacitor arranged so that the first conductor 702a electrically contacts an outer surface 318 of the second conductor 312 at the first base portion 307a and the second conductor 702b electrically contacts an outer portion 318 of the second conductor 312 at the second base portion 307b. The flexible capacitor 700 is bonded to the base portions 307a, 307b such that an electrically stable connection is established (e.g., solder). In an example flexible capacitor, a copper clad laminate coating each side of a flexible dielectric material is used as the capacitive element. The flexible capacitor is then, for example, soldered to the helically wound transmission line at joining points 307a, 307b, ensuring that the two plates of the flexible capacitor 702a, 702b are bonded to opposing sides of the helix. The flexible capacitor can then be wrapped around the helix ensuring that electrical contact is not made between 702a and 702b.

An example flexible capacitor can include first and second conductive plates formed in a flexible printed circuit board (PCB) material, for example. Alternatively, an example flexible capacitor can include first and second conductive plates formed out of a copper cladding on either side of a flexible dielectric sheet, for example. The value of an example flexible capacitance can be tuned based upon one or more factors such as material properties of the dielectric, thickness of the dielectric, and area of the conductive sheets. The capacitance also can be varied based upon number of internal conductive layers between the outer conductive surfaces 702a and 702b within the dielectric 704. Thus, a flexible capacitor can add additional ways to tune the resonant frequency of an example resonant trap. For example, since the area of the conductor plates determines capacitance, tuning of the resonant trap can be realized by changing the total area of the flexible capacitor (e.g., cutting a capacitive sheet to reduce an area dimension decreases capacitance). Additionally, changing the thickness of the dielectric of the flexible capacitor can change capacitance. Moreover, as shown in FIG. 7B, a flexible capacitive element 700 can be wrapped around portions of the transmission line to reduce the profile of the resonant trap without reducing its flexibility. Moreover, a longer scroll-like wrap of the capacitor can allow for a longer capacitor to be used without shorting the sides together (702a, 702b) or significantly increasing the size/profile of the resonant trap. The arrows 713 indicate how scroll, optionally, can continue to wrap.

A flexible capacitive element can exhibit improved mechanical stability such as improved resistance to damage due to impact, for example. A mechanical limitation (under impact) of the flexible capacitor is the bond between the cable and the capacitor, whereas a ceramic chip capacitor or integrated circuit capacitor can more easily shatter under impact. A resonant trap with a flexible capacitor can be tuned by cutting a capacitive sheet that is rolled into contact with the base portions of the first and second segments. Thus, a resonant trap with a flexible capacitor can be relatively easy to tune.

FIG. 8A is an illustrative drawing showing an example resonant trap 800 with a helical winding (not visible) enclosed within a cover 802 and including a rolled capacitor 804, with the helical winding (beneath the cover) extending in a generally linear arrangement. FIG. 8B is an illustrative drawing showing a corresponding example measured frequency attenuation response at 127 Mhz of the resonant trap of FIG. 8A. The cover, which can be plastic for example, prevents the helix from unwinding.

FIG. 9A is an illustrative drawing showing the example resonant trap 800 of FIG. 8A with the helical winding (not visible) within a cover 802 bent at an angle of about one-hundred and eighty degrees at about midway along the length of its helical winding portion. FIG. 9B is an illustrative drawing showing a corresponding example measured frequency attenuation response at about 127 Mhz for the folded trap. Thus, bending of the helical winding portion of the resonant trap has little impact upon frequency blocking properties. More particularly, self-shielding provided by the helical winding portion 304 results in the resonant trap 300, 800 being substantially impervious to bending along the center axis 510. Furthermore, self-shielding also results in the resonant trap 300, 800 being substantially impervious to twisting about the center axis 510. Moreover, the absence of a rigid solid core material within the trap 800 and the absence of a rigid Faraday cage enclosing the trap 800 allows flexibility of the trap's winding so that it can be folded without changing its frequency attenuation.

FIG. 10A is an illustrative drawing showing two example resonant traps 800A, 800B, each identical to the resonant trap 800 of FIG. 8A arranged side-by-side. FIG. 10B is an illustrative drawing showing a corresponding example measured frequency attenuation response at 127 Mhz for the two side-by-side traps 800A, 800B. It will be appreciated that the innate self-shielding of the resilient traps 800A, 800B permits their arrangement close by to one another without shifting the frequency attenuation of either of them. The self-shielding of the helical structure 304 makes the resonant traps insensitive to external field and load changes.

Figure 11A:
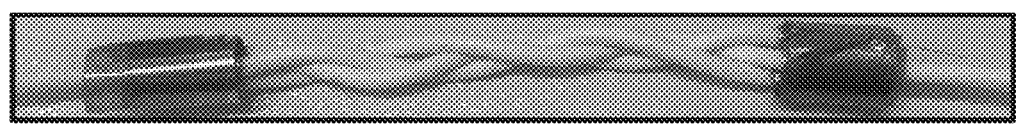
FIG. 11A is an illustrative side view showing an example resonant trap that includes a transmission line that is folded and braided to produce three helical winding segments.
Figure 11B:
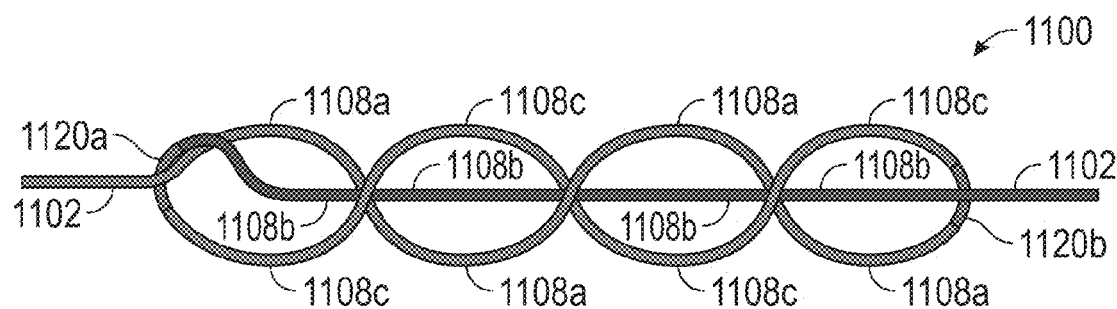
FIG. 11B is a simplified layout schematic view of the resonant trap showing a representation of the folding and braiding of the three helical winding segments of FIG. 11A.
Figure 11C:
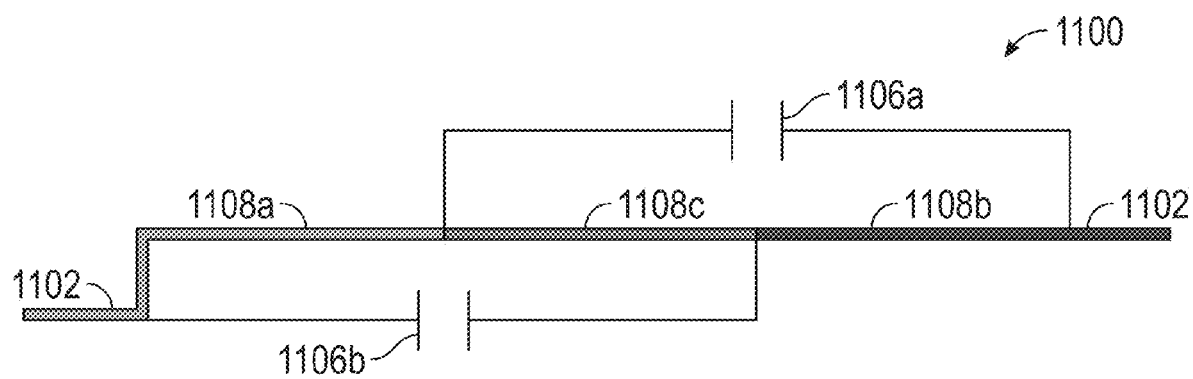
FIG. 11C is an example electrical schematic representation of the resonant trap of FIG. 11A.
Figure 11D:
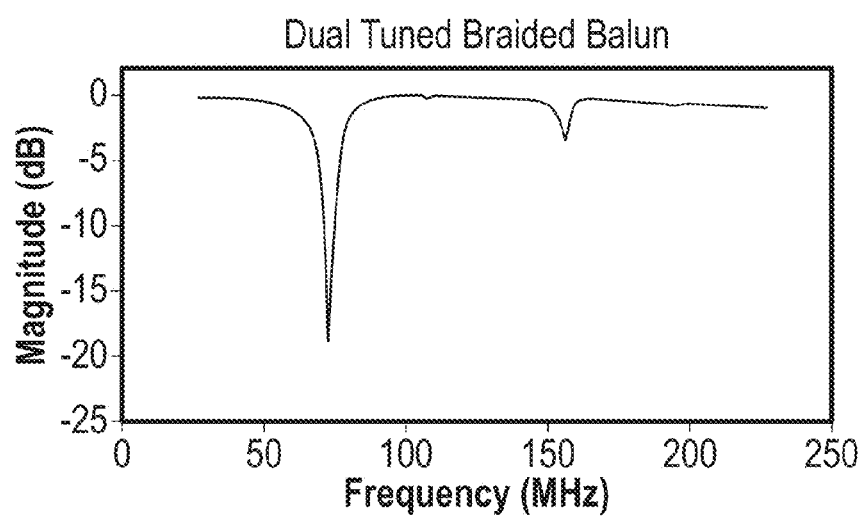
FIG. 11D is an illustrative drawing showing an example frequency attenuation response for the example resonant trap of FIG. 11A.

FIG. 11A is an illustrative side view showing an example resonant trap 1100 that includes a transmission line that is folded and braided to produce three helical winding segments 1108a, 1108b, 1108c. FIG. 11B is a simplified layout schematic view of the resonant trap 1100 showing a representation of the folding and braiding of the three helical winding segments 1108a, 1108b, 1108c. The resonant trap 1100 includes a first folded portion 1120a between the second segment 1108b and the third segment 1108c and includes a second folded portion 1120b between the third segment 1108c and the first segment 1108a. To simplify the drawing, the second segment 1108b is shown as a straight line. FIG. 11C is an example electrical schematic representation of the resonant trap 1100. A first capacitor 1106a is coupled between the second segment 1108b and 1120b, the juncture between the first segment 1108a and the third segment 1108c. A second capacitor 1106b is coupled between the first segment 1108a and 1120a, the juncture between the second segment 1108b and the third segment 1108c. FIG. 11D is an illustrative drawing showing corresponding example frequency attenuation responses at 75 MHz and 160 MHz for the example resonant trap 1100. It will be appreciated that more than three helical winding segments can be wound within a trap circuit and corresponding capacitor circuits can be provided to add additional attenuation responses. However, the addition of more segments increases stiffness and reduces flexibility of the trap. Capacitance and inductance may also be chosen in respective subsections to tune each subsection of the trap to a single frequency, providing additional points of resistance to common mode currents.

Figure 12A:
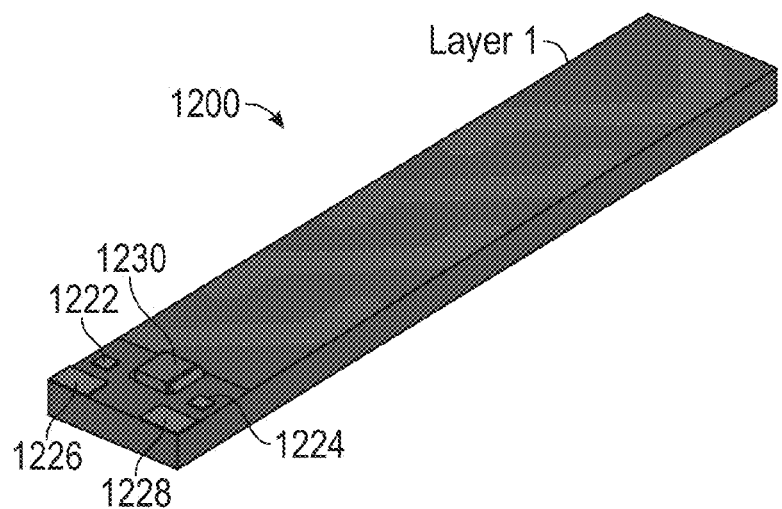
FIG. 12A is an illustrative perspective view of an example printed circuit board resonant trap circuit.
Figure 12B:
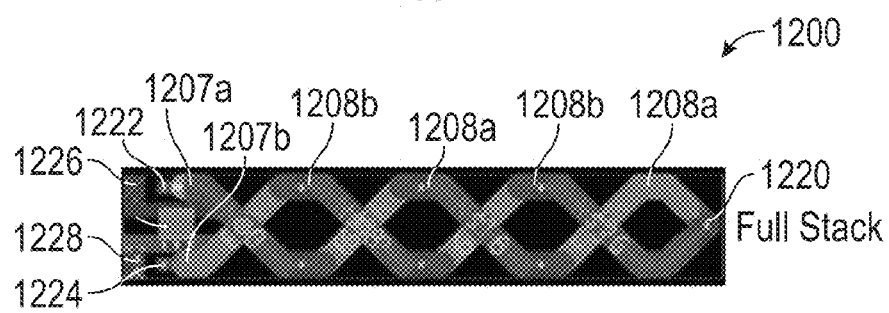
FIG. 12B is an illustrative side cross-section view of the example printed circuit board resonant trap circuit showing multiple stacked flat conductor layers embedded in a substrate such as a dielectric material
Figure 12C:
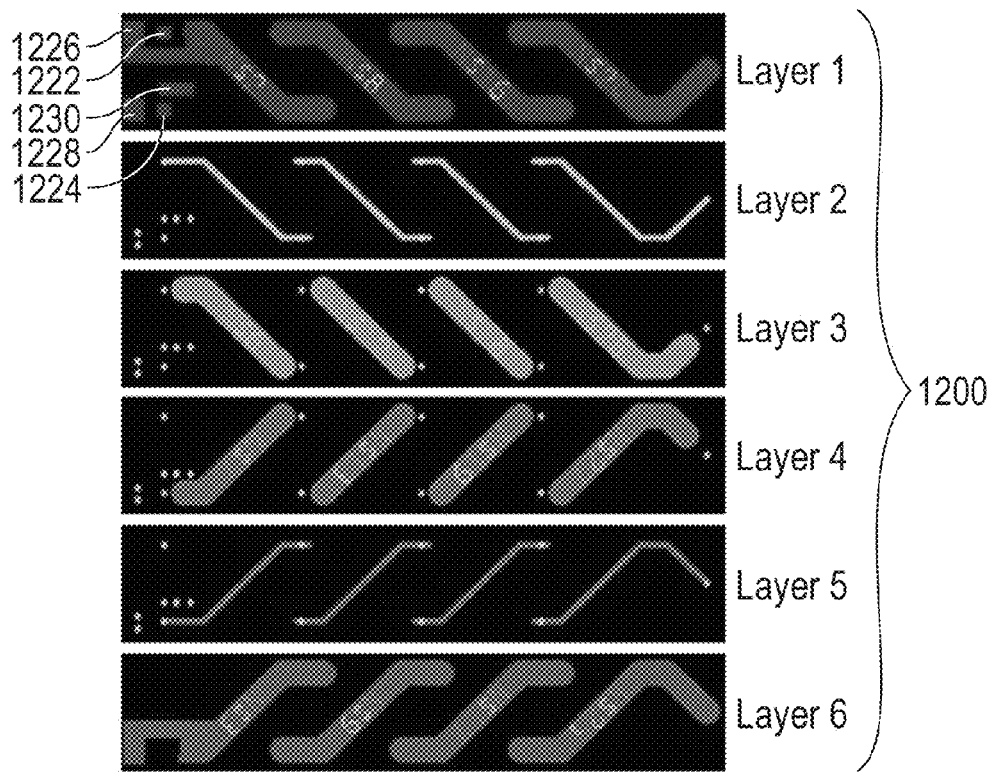
FIG. 12C is an illustrative drawing showing separate cross-section views of individual stacked conductor layers of the example printed circuit board resonant trap circuit.

FIG. 12A is a perspective view of an example printed circuit board (PCB) (hereinafter 'PCB trap') resonant trap circuit 1200. FIG. 12B is an illustrative side cross-section view of the example PCB trap 1200 showing multiple stacked flat conductor layers embedded in a substrate such as a dielectric, for example polymeric or ceramic materials, arranged to form respective first and second helical segments 1208a, 1208b of a helical winding 1204. The flexibility of the PCB trap is directly related to the flexibility of the substrate layers. If an example PCB trap is printed on a flexible film, for example on a polyimide film, the PCB trap would be innately flexible, whereas if an example PCB trap is printed on an inflexible film, for example XPC, the PCB trap would not be flexible. FIG. 12C is an illustrative drawing showing six separate cross-section views of individual stacked conductor layers of FIG. 12B illustratively shown arranged side-by-side. The example PCB trap 1200 includes conductor layers 1-6. Conductor layer 1 is at the top of the PCB trap and conductor layer 6 is at the bottom of the PCB. Each of substrate layers 1-6 is printed onto a separate layer of the PCB trap, and vias are used to electrically connect different layers of the PCB together. Directional references to top, bottom, and vertical, for example, are used for convenience only and are not intended to be limiting. Other example PCB traps (not shown) can include a different number of layers, for example. It will be understood that a PCB trap can include a strip line, or microstrip or other microstrip line constructed from flexible circuit board, for example.

Referring to FIG. 12A, a top conductor layer 1 of the PCB trap 1200 includes first and second signal pads 1222, 1224, includes first and second ground pads 1226, 1228. The capacitor 1230 is not shown. Referring to FIG. 12B, a first base portion 1207a of the first helical segment 1208a, which is analogous to 307a of resonant trap 300 of FIG. 3, extends between locations of the first signal pad 1222 and the first ground pad 1226 and an apex portion 1220 that is analogous to the folded portion 320 of the resonant trap 300 of FIG. 3. A second base portion 1207b of the second helical segment 1208b, which is analogous to 307b of resonant trap 300 of FIG. 3, extends between locations of the second signal pad 1224 and the second ground pad 1228 and the apex portion 1220. The first and second helical segments 1208a, 1208b form a continuous electrical circuit that extends through the apex portion 1220 so that, for example, current can flow up one of the first and second helical segments 1208a, 1208b and down the other. In operation, the first and second helical segments 1208a, 1208b shield one another from external magnetic fields by the same self-shielding mechanism as the resonant trap 300 of FIG. 3.

Referring to FIGS. 12B-12C, helical winding segments 1208a,1208b include three conductive traces, which pass between layers on the PCB to create a helical twist. Referring to the first helical winding segment 1208a as an example, a differential signal is passed to the trap at signal and ground pad inputs, 1222 and 1226 respectively. The signal passed to 1222 is then directed to Layer 2 through a via, and travels along the path 1208a, passing between layers 2 and 5, to the apex portion 1220. The ground reference, passed onto the PCB through pad 1226, is connected to path 1208a on layer 1 directly, and to path 1208a on layer 3 by a via. The ground trace then travels along 1208a, passing back and forth between layers 1 and 3, and layers 4 and 6, to apex point 1220. The example conductor layers 1 and 3 are wider than the example conductor layer 2 and in the vertically stacked configuration of FIG. 12B, signal conductor layer 2 acts as a signal conductor trace located between ground conductor layers 1 and 3, which together act as a ground plane surrounding the signal. Similarly, example conductor layers 4 and 6 act as a ground, and example conductor layer 5 acts as a signal conductor trace. The example conductor layers 4 and 6 are again wider than the example conductor layer 5 and in the stacked configuration of FIG. 12B, signal conductor layer 5 is located between ground conductor layers 4 and 6.

Respective conductor vias formed in the substrate material electrically couple corresponding locations of the conductor layers 2 and 5. Respective conductor vias formed in the dielectric material also electrically couple corresponding locations of the outer ground conductor layers 1 and 6. Respective conductor vias formed in the dielectric material can also be placed to electrically couple corresponding locations between equivalent ground layers 1 and 3, and 4 and 6 (not shown).

Currents within the PCB trap take the shortest path along the conductor layers within the PCB trap 1200, just as they are shown to do in resonant trap 300 of FIG. 5C. Ground conductor layers 3 and 4 are inner facing ground layers closest to one another within the PCB trap, and therefore, the largest current flow is likely to be within ground conductor layers 3 and 4. This is similar to the larger current flow at inner facing portions of the first and second helical winding segments 308a, 308b of the coaxial cable resonant trap 300 of FIG. 3, for example. Ground conductor layers 1 and 6 are outer facing layers that are farthest from one another, and therefore, least current flow is likely to be within ground conductor layers 1 and 6. This is similar to the lesser current flow at outer facing portions of the first and second helical winding segments 308a, 308b of the coaxial cable resonant trap 300 of FIG. 3, for example.

The ground layer 1 is electrically coupled to the first ground pad 1226. A respective via couples the second ground pad 1228 to the ground layer 6. A respective via electrically couples the first signal pad 1222 to the signal conductor layer 2. A respective via electrically couples the second signal pad 1224 to the signal conductor layer 5. A first terminal of the capacitor 1230 is electrically coupled to the ground conductor layer 1 and a via at pad 1230 electrically couples a second terminal of the capacitor to the ground conductor layer 6.

Figure 13:
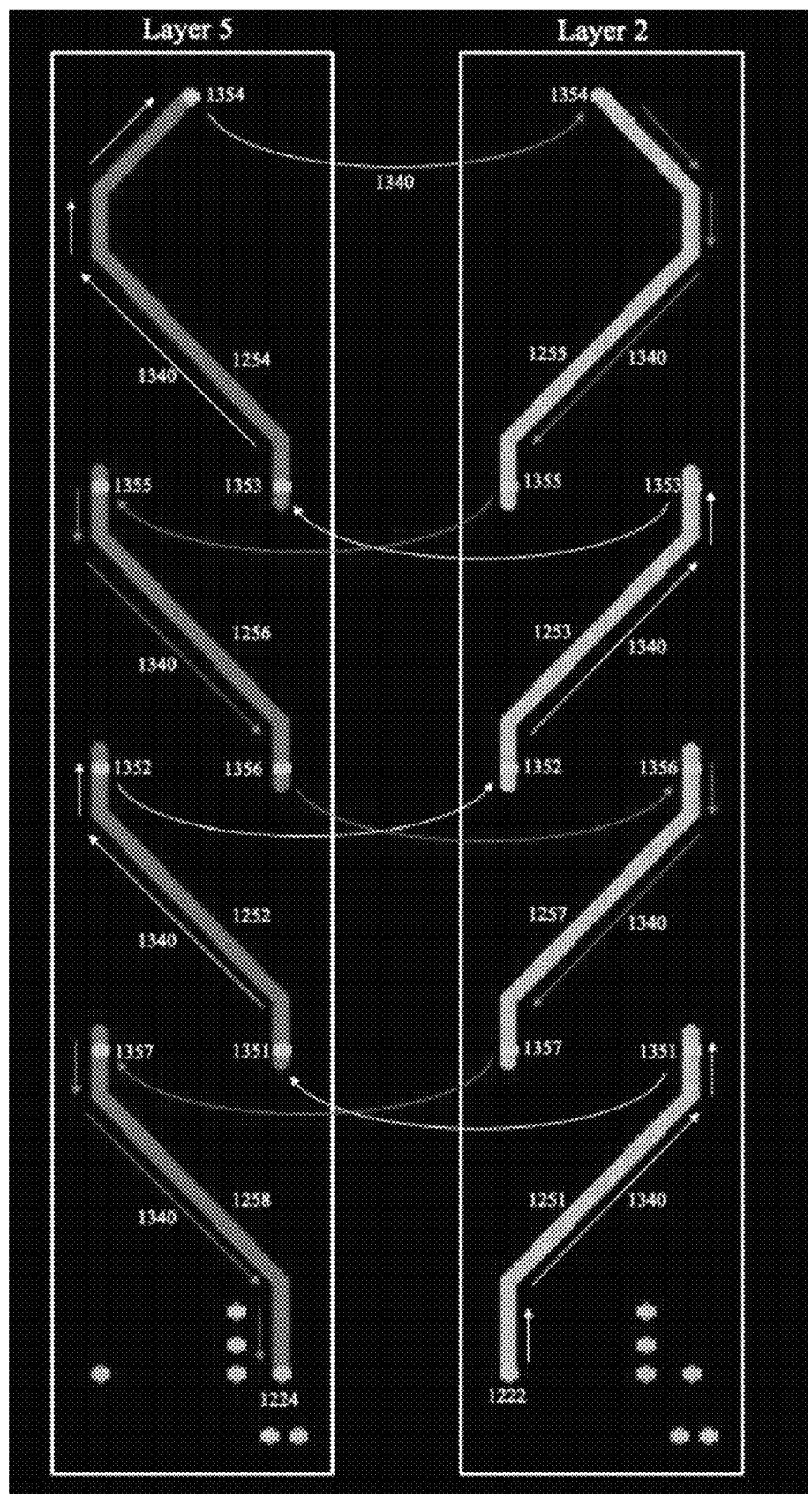
FIG. 13 is an illustrative schematic diagram showing example signal current flow up, down, and across within the example printed circuit board resonant trap circuit of FIGS. 12A-12C.

FIG. 13 is an illustrative schematic diagram showing example signal current flow up, down, and across within the PCB trap 1200 between the signal conductor layer 2 and the signal conductor layer 4. Example current 1340 flows into the PCB through pad 1222 on layer 1, and is passed through a via onto layer 2. Current then flows along signal conductor segment 1251 across layer 2 and through via 1351 to signal conductor segment 1252 in layer 5. Current 1340 next flows along signal conductor segment 1252 across layer 5 and through via 1352 to signal conductor segment 1253 in layer 2. Current 1340 next flows along signal conductor segment 1253 across layer 2 and through via 1353 to signal conductor segment 1254 in layer 5. Current 1340 next flows along signal conductor segment 1254 across layer 5 and through via 1354 to signal conductor segment 1255 in layer 2. It is noted that the via 1354 corresponds in general to the folded region 320 at the apex of the helical winding 300 of FIG. 3. Current 1340 next flows along signal conductor segment 1255 across layer 2 and through via 1355 to signal conductor segment 1256 in layer 5. Current 1340 next flows along signal conductor segment 1256 across layer 5 and through via 1356 to signal conductor segment 1257 in layer 2. Current 1340 next flows along signal conductor segment 1257 across layer 2 and through via 1357 to signal conductor segment 1258 in layer 5. The signal is then passed back through a via to pad 1224 on layer 1. Example conductor segments 1251, 1252, 1253 and 1254 are constituents of the first helical segment 1208*a*. Example conductor segments 1255, 1256, 1257 and 1258 are constituents of the second helical segment 1208*b*. In the color version of FIG. 13, a current path 1340 portion within the first helical segment 1208*a* is color labeled white and the current path portion 1340 within the second helical segments 1208*b* is color labeled blue. Thus, the example arrangement of the signal conductor segments 1251, 1253, 1255 and 1257 in substrate layer 2 and the arrangement of signal conductors 1252, 1254, 1256 and 1258 in substrate layer 5 and the coupling of segments by vias 1351-1357 to cause current flow to follow a helical path within the substrate material of the PCB trap 1200 is analogous to helical current flow within the resonant trap 300 of FIG. 3. Persons skilled in the art will appreciate that the ground conductor layers 1, 3, 4 and 6 are similarly arranged in segments that follow helical ground conductor paths within the substrate material of the PCB trap 1200 with the conductor segments between them.

The example resonant trap circuits 300, 1100 and 1200 have a wide application. Power lines that carry digital or analog power control signals can extend through magnetic fields. The example resonant trap circuits can be used to prevent the power lines from acting as antennas in the presence of a magnetic field by attenuating signals at the magnetic field frequency, for example. The resonant traps in essence chop up the power lines into shorter segments that do not resonate in the presence of a magnetic field. The example resonant trap circuits can be used in other radio frequency (RF) applications such as cell-phones, RF broadband, laptops, for example.

VARIOUS EXAMPLES

Examples of the resonant trap can include:

Example 1 includes a resonant trap circuit comprising: a conductor line arranged to include a helical winding portion that includes a first helical winding segment and a second helical winding segment that are helically twisted together; and capacitor arranged to provide capacitance between the first helical winding segment and the second helical winding segment.

Example 2 can include the subject matter of Example 1 wherein flexibility of the helical winding portion is proportional to flexibility of the conductor line.

Example 3 can include the subject matter of Example 1 wherein the resonant trap has a frequency dependent resistance; wherein the helical winding portion includes an axis of symmetry that extends longitudinally within the helical winding portion equidistant from the first and second helical winding segments; and wherein the helical winding portion can be bent along the axis of symmetry without substantially changing the frequency attenuation response.

Example 3 can include the subject matter of Example 3 wherein the helical winding portion can be bent up to one hundred and eighty degrees along the axis of symmetry without substantially changing the frequency attenuation response.

Example 5 can include the subject matter of Example 1 wherein the resonant trap has a frequency attenuation response; wherein the helical winding portion includes an axis of symmetry that extends longitudinally within the helical winding portion equidistant from the first and second helical winding segments; and wherein the helical winding portion can be deformed about the axis of symmetry without substantially changing the frequency attenuation response.

Example 6 can include the subject matter of Example 3 wherein the helical winding portion can be deformed up to three hundred and sixty degrees about the axis of symmetry without substantially changing the frequency attenuation response.

Example 7 can include the subject matter of Example 1 wherein a thickness of the helical winding is proportional to thickness of the conductor line.

Example 8 can include the subject matter of Example 1 wherein a thickness of the helical winding is proportional to number of winding segments in the helical winding portion.

Example 9 can include the subject matter of Example 1 wherein the helical winding portion is arranged to include a folded portion that demarcates a junction of the first helical winding segment and the second helical winding segment.

Example 10 can include the subject matter of Example 1 further including:
 a conductor material deposited upon a portion of the folded portion to adjust inductance of the helical winding portion.

Example 11 can include the subject matter of Example 1 wherein the conductor line segment is arranged to include a folded portion having a one-hundred and eighty-degree fold at a junction of the first helical winding segment and the second helical winding segment.

Example 12 can include the subject matter of Example 1 wherein the helical winding portion includes a folded portion at a junction of the first helical winding segment and the second helical winding segment; wherein the first helical winding segment includes a first base portion and extends between the first base portion and the folded portion; and wherein the second helical winding segment includes a second base portion and extends between the second base portion and the folded portion.

Example 13 can include the subject matter of Example 1 wherein the capacitor includes a self-capacitance between the first helical winding segment and the second helical winding segment.

Example 14 can include the subject matter of Example 1 wherein the capacitor includes at least one external capacitor electrically coupled between the first base portion and the second base portion.

Example 15 can include the subject matter of Example 1 wherein the first helical winding segment includes one or more respective first inner-facing surface portions; wherein the second helical winding segment includes one or more respective second inner-facing surface portions; and wherein the one or more first inner facing surface portions face the one or more second inner facing surface portions.

Example 16 can include the subject matter of Example 1 wherein opposed facing surfaces of the first helical winding segment and the second helical winding segment are arranged within the helical portion to self-shield magnetic and electric fields caused by current flow within the helical winding portion.

Example 17 can include the subject matter of Example 1 wherein the conductor line includes a transmission line and the helical winding portion includes a continuous portion of the transmission line.

Example 18 can include the subject matter of Example 1 wherein the conductor line includes a transmission line that includes a first conductor, a second conductor, and a dielectric material therebetween; and wherein the capacitor includes at least one external capacitor coupled between a portion of the second conductor at the first helical winding segment and a portion of the second conductor at the second helical winding segment.

Example 19 can include the subject matter of Example 1 wherein the conductor line includes a includes a coaxial cable that includes an outer conductor an inner conductor and a dielectric material therebetween;
wherein the capacitor includes at least one external capacitor coupled between a portion of the outer conductor at the first helical winding segment and a portion of the outer conductor at the second helical winding segment.

Example 20 can include the subject matter of Example 1 wherein the conductor line includes a transmission line that includes at least two conductors separated by a dielectric.

Example 21 can include the subject matter of Example 1 wherein the capacitor includes at least one external capacitor coupled between the first helical winding segment and the second helical winding segment; wherein the conductor line includes a transmission line that includes at least two conductors separated by a dielectric; and wherein at least one portion of the at least two conductors is coupled to the at least one capacitor and at least one other portion of the at least two conductors is not coupled to the at least one capacitor.

Example 22 can include the subject matter of Example 1 wherein the conductor line includes a transmission line that includes at least two conductors separated by a dielectric; wherein the at least one portion of the at least two conductors acts as a differential signal line; and wherein the at least one other portion of the at least two conductors acts as a potential reference for the differential signal line.

Example 23 can include the subject matter of Example 1 wherein the capacitor includes at least one external capacitor coupled between the first helical winding segment and the second helical winding segment; wherein the conductor line includes a transmission line that includes at least two conductors separated by a dielectric; wherein the transmission line includes a differential line and a ground shield; and wherein at least one capacitor is coupled between a portion of the ground shield at the first helical winding segment and a portion of the ground shield at the second helical winding segment.

Example 24 can include the subject matter of Example 1 wherein the at least one capacitor includes multiple capacitive elements.

Example 25 can include the subject matter of Example 1 wherein the at least one capacitor includes a distributed capacitance between the first helical winding segment and the second helical winding segment.

Example 26 can include the subject matter of Example 1 wherein the conductor line includes a includes a coaxial cable that includes an outer conductor an inner conductor and a dielectric material therebetween; and wherein the at least one capacitor includes a distributed capacitance supplied by one of two or more shields of the coaxial cable.

Example 27 can include the subject matter of Example 1 wherein the capacitor includes at least one external capacitor coupled between the first helical winding segment and the second helical winding segment; wherein the at least one capacitor includes a dielectric layer including first and second conductor layers on opposite sides thereof, arranged with the first conductor layer mechanically and/or electrically contacting the first helical winding segment and with the second helical winding segment mechanically and/or electrically contacting the second helical winding segment.

Example 28 can include the subject matter of Example 27 wherein the dielectric material includes a flexible dielectric material.

Example 29 can include the subject matter of Example 1 further including: a flexible cover surrounding at least a portion of the helical winding portion and preventing unwinding of the helical winding portion.

Example 30 can include the subject matter of Example 1 wherein the conductor line includes a multi-layer printed circuit.

Example 31 can include the subject matter of Example 30 wherein the multi-layer printed circuit includes a layered dielectric substrate and a conductor trace coupled to signal and ground conductors, located at different layers within the layered dielectric substrate; wherein the signal and ground conductor lines both follow a parallel helical path within the substrate.

Example 32 can include the subject matter of Example 30 further including a rigid or flexible layered dielectric substrate; wherein the conductor line includes first and second ground conductors that are located at different layers within the substrate and that follow helical paths within the substrate; and wherein the conductor line further includes a signal conductor located between the first and second ground conductors within the substrate and that follows a helical path within the substrate.

Example 33 can include the subject matter of Example 1 wherein the helical winding portion further includes a third helical winding segment; wherein the first, second and third helical winding segments are twisted together and further including: a capacitance between the second helical winding segment and the first or third helical winding segment.

Examples of the receive circuit can include:

Example 34 includes a receive circuit for use in a magnetic resonance imaging system comprising: a receive coil; a transmission line coupled to the receive coil; and a first resonant trap circuit that includes: a first portion of the transmission line arranged to include a first helical winding portion; and a first capacitor arranged to provide capacitance across a portion of the first helical winding portion.

Example 35 can include the subject matter of Example 34 wherein the first capacitor includes a self-capacitance across the first helical winding portion.

Example 36 can include the subject matter of Example 34 wherein the first capacitor includes at least one external capacitor coupled across the first helical winding portion.

Example 37 can include the subject matter of Example 34 further including: two or more resonant trap circuit that respectively include: a respective second portion of the transmission line arranged to include a second helical winding portion; and a respective second capacitor arranged to provide capacitance across a portion of the second helical winding portion.

Example 38 can include the subject matter of Example 37 wherein the first and the respective second resonant traps have a matching frequency attenuation; wherein the first and the respective second resonant trap circuits are spaced apart from one another by no more than one quarter wavelength of the resonant frequency.

Example 39 can include the subject matter of Example 37 wherein the first and the respective second resonant traps attenuate different frequencies.

Example 40 can include the subject matter of Example 35 wherein the first and the respective second resonant trap circuits are located side-by-side.

Example 41 can include the subject matter of Example 35 wherein at least one of the first and the respective second resonant trap circuits is folded at least one hundred and eighty degrees.

Example 42 can include the subject matter of Example 34 wherein the receive coil is formed of a flexible material.

Examples of the receive circuit array pad can include:

Example 43 includes a receive circuit array pad for use in a magnetic resonance imaging system comprising: a plurality of receive coils arranged so that each receive coil overlays at least a portion of another receive coil; a plurality of transmission lines each coupled to a different receive coil; and wherein each respective transmission line is arranged to provide a respective first resonant trap circuit that includes: a respective first portion of the respective transmission line arranged to include a respective first helical winding portion; and a respective first capacitor arranged to provide capacitance across a portion of the respective first helical winding portion.

Example 44 can include the subject matter of Example 43 wherein respective first capacitors include self-capacitance across respective first helical winding portions.

Example 45 can include the subject matter of Example 43 wherein respective first capacitors include respective at least one external capacitor coupled across respective first helical winding portions.

Example 46 can include the subject matter of Example 43 wherein each respective transmission line is arranged to provide a respective second resonant trap circuit that includes: a respective second portion of the transmission line arranged to include a respective second helical winding portion; and a respective second capacitor arranged to provide capacitance across a portion of the respective second helical winding portion.

Example 47 can include the subject matter of Example 46 wherein respective first and second resonant traps formed by a respective transmission line each attenuate a different frequency; wherein respective first and second resonant trap circuits formed by a respective transmission line are spaced apart from one another by no more than one quarter wavelength of the resonant frequency.

Example 48 can include the subject matter of Example 43 wherein the receive coils are formed of a flexible material.

Example 49 can include the subject matter of Example 44 further including:
a housing enclosing the plurality of receive coils, formed of a flexible material.

Example of the method of manufacture can include:

Example 50 includes a method to produce a resonant trap circuit comprising: twisting a portion of a transmission line to form a helical winding portion that includes a first helical winding segment and a second helical winding segment that are helically twisted together and that includes a folded portion at a junction of the first helical winding segment and the second helical winding segment; and coupling at least one capacitor between the first helical winding segment and the second helical winding segment.

Example 51 can include the subject matter of Example 50 wherein coupling includes coupling the capacitor between respective ground shield portions of the transmission line at the respective first and second helical winding segments.

Example 52 can include the subject matter of Example 50 wherein the coupled capacitive element is made of a flexible dielectric sheet covered on two sides by a flexible conductive coating; wherein the flexible capacitive element is wrapped in a scroll-like fashion around the helical twist of the transmission line such that a profile of the circuit is reduced without shorting the capacitor.

Example 53 can include the subject matter of Example 52 wherein tightening or loosening the scroll-like wrap of the capacitive element adjusts the second order inductance and capacitance of the element.

Example 54 can include the subject matter of Example 50 further including: adjusting inductance of the helical winding.

Example 55 can include the subject matter of Example 54 wherein adjusting inductance of the helical winding includes adjusting an amount of conductor at the folded portion.

Example 56 can include the subject matter of Example 54 wherein adjusting inductance of the helical winding includes adjusting radius of the helical winding portion.

Example 57 can include the subject matter of Example 54 wherein adjusting inductance of the helical winding includes adjusting an amount of conductive shield around the helical winding.

Example 58 can include the subject matter of Example 54 wherein adjusting inductance of the helical winding includes adjusting a position where the capacitor is coupled to the helical winding.

Example 59 can include the subject matter of Example 50 further including: placing a flexible cover about the helical winding.

Example 60 can include the subject matter of Example 50 wherein a length of transmission line is laced through the helical winding, forming an additional leg of the helix.

Example 61 can include the subject matter of Example 60 wherein the transmission line forming the additional leg of the helix is electrically continuous with the transmission line forming one of the first two legs of the helical winding.

Example 62 can include the subject matter of Example 60 wherein a transmission line is added to a helical winding containing more than two portions.

Example 61 can include the subject matter of Example 60 wherein a capacitor is coupled between the ground shield of an additional leg of the helix and one or more of the original helical windings.

The above description is presented to enable any person skilled in the art to create and use a resonant trap. Various modifications to the examples will be readily apparent to those skilled in the art, and the generic principles defined herein may he applied to other examples and applications without departing from the spirit and scope of the invention. In the preceding description, numerous details are set forth for the purpose of explanation. However, one of ordinary skill in the art will realize that the examples in the disclosure might be practiced without the use of these specific details. In other instances, well-known processes are shown in block diagram form in order not to obscure the description of the invention with unnecessary detail. Identical reference numerals are used in some places to represent different views of the same or similar items in different drawings. Thus, the foregoing description and drawings of embodiments and examples are merely illustrative of the principles of the invention. Therefore, it will be understood that various modifications can be made to the embodiments by those skilled in the art without departing from the spirit and scope of the invention, which is defined in the appended claims.

The invention claimed is:

1. A resonant trap circuit comprising:
a conductor line arranged to include a helical winding portion that includes a first helical winding segment and a second helical winding segment that are helically twisted together, and to include a folded portion at a junction between the first helical winding segment and the second helical winding segment; and
a capacitor arranged to provide capacitance between the first helical winding segment and the second helical winding segment;
wherein the first helical winding segment includes a first base portion and extends between the first base portion and the folded portion;
wherein the second helical winding segment includes a second base portion and extends between the second base portion and the folded portion;
wherein the first and second helical winding segments are helically wound to include respective inner-facing surfaces that face toward one another, such that a shortest current flow path between the first base portion and the second base portion is along an inner-facing surface of the first helical winding segment, along an inner-facing surface of the second helical winding segment, and across the folded portion;
wherein the helical winding portion includes an axis of symmetry that extends longitudinally within the helical winding portion, between the inner-facing surfaces of the respective first and second helical winding segments that face toward one another, equidistant from the first and second helical winding segments.

2. The resonant trap circuit of claim 1,
wherein the resonant trap circuit has a frequency dependent resistance;
wherein the helical winding portion includes an axis of symmetry that extends longitudinally within the helical winding portion equidistant from the first and second helical winding segments; and
wherein the helical winding portion can be bent along the axis of symmetry without substantially changing a frequency attenuation response of the resonant trap circuit.

3. The resonant trap circuit of claim 1,
wherein the helical winding portion can be bent up to one hundred and eighty degrees along the axis of symmetry without substantially changing a frequency attenuation response of the resonant trap circuit.

4. The resonant trap circuit of claim 1,
wherein the helical winding portion can be deformed up to three hundred and sixty degrees about the axis of symmetry without substantially changing a frequency attenuation response of the resonant trap circuit.

5. The resonant trap circuit of claim 1, further including:
a conductor material deposited upon a portion of the folded portion to adjust inductance of the helical winding portion.

6. The resonant trap circuit of claim 1,
wherein the conductor line segment is arranged to include a folded portion having a one-hundred and eighty-degree fold at a junction of the first helical winding segment and the second helical winding segment.

7. The resonant trap circuit of claim 1,
wherein the capacitor includes a self-capacitance between the first helical winding segment and the second helical winding segment.

8. The resonant trap circuit of claim 1,
wherein the capacitor includes at least one external capacitor electrically coupled between the first base portion and the second base portion.

9. The resonant trap circuit of claim 1,
wherein the conductor line includes a transmission line and the helical winding portion includes a continuous portion of the transmission line.

10. The resonant trap circuit of claim 1,
wherein the conductor line includes a transmission line that includes a first conductor, a second conductor, and a dielectric material therebetween; and
wherein the capacitor includes at least one external capacitor coupled between a portion of the second conductor at the first helical winding segment and a portion of the second conductor at the second helical winding segment.

11. The resonant trap circuit of claim 1,
wherein the conductor line includes a includes a coaxial cable that includes an outer conductor an inner conductor and a dielectric material therebetween;
wherein the capacitor includes at least one external capacitor coupled between a portion of the outer conductor at the first helical winding segment and a portion of the outer conductor at the second helical winding segment.

12. The resonant trap circuit of claim 1,
wherein the conductor line includes a transmission line that includes at least two conductors separated by a dielectric.

13. The resonant trap circuit of claim 1,
wherein the capacitor includes at least one external capacitor coupled between the first helical winding segment and the second helical winding segment;
wherein the conductor line includes a transmission line that includes at least two conductors separated by a dielectric; and
wherein at least one portion of the at least two conductors is coupled to the at least one capacitor and at least one other portion of the at least two conductors is not coupled to the at least one capacitor.

14. The resonant trap circuit of claim 1,
wherein the conductor line includes a transmission line that includes at least two conductors separated by a dielectric;
wherein at least one portion of the at least two conductors acts as a differential signal line; and
wherein at least one other portion of the at least two conductors acts as a potential reference for the differential signal line.

15. The resonant trap circuit of claim 1,
wherein the capacitor includes at least one external capacitor coupled between the first helical winding segment and the second helical winding segment;
wherein the conductor line includes a transmission line that includes at least two conductors separated by a dielectric;
wherein the transmission line includes a differential line and a ground shield; and
wherein at least one capacitor is coupled between a portion of the ground shield at the first helical winding segment and a portion of the ground shield at the second helical winding segment.

16. The resonant trap circuit of claim 1,
wherein the capacitor includes multiple capacitive elements.
17. The resonant trap circuit of claim 1,
wherein the one capacitor includes a distributed capacitance between the first helical winding segment and the second helical winding segment.
18. The resonant trap circuit of claim 1,
wherein the conductor line includes a includes a coaxial cable that includes an outer conductor an inner conductor and a dielectric material therebetween; and
wherein the capacitor includes a distributed capacitance supplied by one of two or more shields of the coaxial cable.
19. The resonant trap circuit of claim 1,
wherein the capacitor includes at least one external capacitor coupled between the first helical winding segment and the second helical winding segment;
wherein the at least one capacitor includes a dielectric layer including first and second conductor layers on opposite sides thereof, arranged with the first conductor layer mechanically and/or electrically contacting the first helical winding segment and with the second helical winding segment mechanically and/or electrically contacting the second helical winding segment.
20. The resonant trap circuit of claim 18,
wherein the dielectric material includes a flexible dielectric material.
21. The resonant trap circuit of claim 1 further including:
a flexible cover surrounding at least a portion of the helical winding portion and preventing unwinding of the helical winding portion.
22. The resonant trap circuit of claim 1,
wherein the conductor line includes a multi-layer printed circuit.
23. The resonant trap circuit of claim 22,
wherein the multi-layer printed circuit includes a layered dielectric substrate and a conductor trace coupled to signal and ground conductor lines, located at different layers within the layered dielectric substrate;
wherein the signal and ground conductor lines both follow a parallel helical path within the substrate.
24. The resonant trap circuit of claim 23 further including:
a rigid or flexible layered dielectric substrate;
wherein the conductor line includes first and second ground conductors that are located at different layers within the substrate and that follow helical paths within the substrate; and
wherein the conductor line further includes a signal conductor located between the first and second ground conductors within the substrate and that follows a helical path within the substrate.
25. The resonant trap circuit of claim 1,
wherein the helical winding portion further includes a third helical winding segment;
wherein the first, second and third helical winding segments are twisted together and further including:
a capacitance between the second helical winding segment and the first or third helical winding segment.
26. The resonant trap circuit of claim 1,
wherein the capacitor includes a flexible capacitive element that includes a dielectric sheet covered on two sides by a flexible conductive coating;
wherein the flexible capacitive element is wrapped in a scroll-like fashion around the helical twist of a transmission line such that a profile of the circuit is reduced without shorting the capacitor.

27. The resonant trap circuit of claim 1,
wherein the capacitor includes a capacitive element that includes a flexible dielectric sheet covered on a first side by a first flexible conductor layer and covered on a second side with a second flexible conductor layer;
wherein a first portion of the capacitive element is wrapped in a scroll-like fashion about the helical winding portion such that the first flexible conductor layer electrically contacts the first base portion of the conductor line and the second flexible conductor layer electrically contacts the second base portion of the conductor line.
28. The resonant trap circuit of claim 27,
wherein the conductor line includes a transmission line that includes a first conductor, a second conductor, and a dielectric material therebetween; and
wherein the first flexible conductor layer electrically contacts the first conductor at the first base portion of the conductor line and the second flexible conductor layer electrically contacts the first conductor at the second base portion of the conductor line.
29. The resonant trap circuit of claim 28, further including:
an insulative layer surrounding the conductor line that includes respective openings at the first and second base portions for the respective electrical contact between the first flexible conductor layer and the first conductor at the first base portion and for the respective electrical contact between the second flexible conductor layer and the first conductor at the second base portion.
30. The resonant trap circuit of claim 1,
wherein the folded portion is symmetrical about the axis of symmetry.
31. A resonant trap circuit comprising:
a conductor line arranged to include a helical winding portion that includes a first helical winding segment and a second helical winding segment that are helically twisted together; and
capacitor arranged to provide capacitance between the first helical winding segment and the second helical winding segment;
wherein the resonant trap circuit has a frequency dependent resistance;
wherein the helical winding portion includes an axis of symmetry that extends longitudinally within the helical winding portion equidistant from the first and second helical winding segments; and
wherein the helical winding portion can be bent along the axis of symmetry without substantially changing a frequency attenuation response of the resonant trap ciruit.
32. The resonant trap circuit of claim 31,
wherein flexibility of the helical winding portion is proportional to flexibility of the conductor line.
33. The resonant trap circuit of claim 31,
wherein the helical winding portion can be bent up to one hundred and eighty degrees along the axis of symmetry without substantially changing the frequency attenuation response.
34. The resonant trap circuit of claim 31,
wherein the resonant trap circuit has a frequency attenuation response;
wherein the helical winding portion includes an axis of symmetry that extends longitudinally within the helical winding portion equidistant from the first and second helical winding segments; and wherein the helical winding portion can be deformed about the axis of symmetry without substantially changing a frequency attenuation response of the resonant trap circuit.

35. The resonant trap circuit of claim 31,
wherein the helical winding portion can be deformed up to three hundred and sixty degrees about the axis of symmetry without substantially changing the frequency attenuation response.

36. The resonant trap circuit of claim 31,
wherein a thickness of the helical winding is proportional to thickness of the conductor line.

37. The resonant trap circuit of claim 31,
wherein a thickness of the helical winding is proportional to number of winding segments in the helical winding portion.

38. The resonant trap circuit of claim 31,
wherein the helical winding portion is arranged to include a folded portion that demarcates a junction of the first helical winding segment and the second helical winding segment.

39. The resonant trap circuit of claim 38 further including:
a conductor material deposited upon a portion of the folded portion to adjust inductance of the helical winding portion.

40. The resonant trap circuit of claim 38,
wherein the folded portion is symmetrical about the axis of symmetry.

41. The resonant trap circuit of claim 31,
wherein the conductor line segment is arranged to include a folded portion having a one-hundred and eighty-degree fold at a junction of the first helical winding segment and the second helical winding segment.

42. The resonant trap circuit of claim 31,
wherein the helical winding portion includes a folded portion at a junction of the first helical winding segment and the second helical winding segment;
wherein the first helical winding segment includes a first base portion and extends between the first base portion and the folded portion; and
wherein the second helical winding segment includes a second base portion and extends between the second base portion and the folded portion.

43. The resonant trap circuit of claim 42,
wherein the capacitor includes at least one external capacitor electrically coupled between the first base portion and the second base portion.

44. The resonant trap circuit of claim 31,
wherein the capacitor includes a self-capacitance between the first helical winding segment and the second helical winding segment.

45. The resonant trap circuit of claim 31,
wherein the first helical winding segment includes one or more respective first inner-facing surface portions;
wherein the second helical winding segment includes one or more respective second inner-facing surface portions; and
wherein the one or more first inner facing surface portions face the one or more second inner facing surface portions.

46. The resonant trap circuit of claim 45,
wherein opposed facing surfaces of the first helical winding segment and the second helical winding segment are arranged within the helical portion to self-shield magnetic and electric fields caused by current flow within the helical winding portion.

47. The resonant trap circuit of claim 31, wherein the conductor line includes a transmission line and the helical winding portion includes a continuous portion of the transmission line.

48. The resonant trap circuit of claim 31,
wherein the conductor line includes a transmission line that includes a first conductor, a second conductor, and a dielectric material therebetween; and
wherein the capacitor includes at least one external capacitor coupled between a portion of the second conductor at the first helical winding segment and a portion of the second conductor at the second helical winding segment.

49. The resonant trap circuit of claim 31,
wherein the conductor line includes a transmission line that includes at least two conductors separated by a dielectric.

50. The resonant trap circuit of claim 31, wherein the capacitor includes at least one external capacitor coupled between the first helical winding segment and the second helical winding segment; wherein the conductor line includes a transmission line that includes at least two conductors separated by a dielectric; and wherein at least one portion of the at least two conductors is coupled to the at least one capacitor and at least one other portion of the at least two conductors is not coupled to the at least one external capacitor.

51. The resonant trap circuit of claim 31,
wherein the conductor line includes a transmission line that includes at least two conductors separated by a dielectric;
wherein at least one portion of the at least two conductors acts as a differential signal line; and
wherein at least one other portion of the at least two conductors acts as a potential reference for the differential signal line.

52. The resonant trap circuit of claim 31, wherein the capacitor includes multiple capacitive elements.

53. The resonant trap circuit of claim 31,
wherein the one capacitor includes a distributed capacitance between the first helical winding segment and the second helical winding segment.

54. The resonant trap circuit of claim 31 further including:
a flexible cover surrounding at least a portion of the helical winding portion and preventing unwinding of the helical winding portion.

55. The resonant trap circuit of claim 31,
wherein the conductor line includes a multi-layer printed circuit.

56. The resonant circuit of claim 31,
wherein the helical winding portion further includes a third helical winding segment;
wherein the first, second and third helical winding segments are twisted together and further including:
a capacitance between the second helical winding segment and the first or third helical winding segment.

57. The resonant trap circuit of claim 31,
wherein the capacitor includes a flexible capacitive element that includes a dielectric sheet covered on two sides by a flexible conductive coating;
wherein the flexible capacitive element is wrapped in a scroll-like fashion around the helical twist of a transmission line such that a profile of the circuit is reduced without shorting the capacitor.

58. The resonant trap circuit of claim 31,
wherein the capacitor includes a capacitive element that includes a flexible dielectric sheet covered on a first side by a first flexible conductor layer and covered on a second side with a second flexible conductor layer;

wherein a first portion of the capacitive element is wrapped in a scroll-like fashion about the helical winding portion such that the first flexible conductor layer electrically contacts a first base portion of the conductor line and the second flexible conductor layer electrically contacts a second base portion of the conductor line.

59. The resonant trap circuit of claim 58, wherein the conductor line includes a transmission line that includes a first conductor, a second conductor, and a dielectric material therebetween; and wherein the first flexible conductor layer electrically contacts the first conductor at the first base portion of the conductor line and the second flexible conductor layer electrically contacts the first conductor at the second base portion of the conductor line.

60. The resonant trap circuit of claim 59, further including:

an insulative layer surrounding the conductor line that includes respective openings at the first and second base portions for the respective electrical contact between the first flexible conductor layer and the first conductor at the first base portion and for the respective electrical contact between the second flexible conductor layer and the first conductor at the second base portion.

61. A resonant trap circuit comprising:

a conductor line arranged to include a helical winding portion that includes a first helical winding segment and a second helical winding segment that are helically twisted together; and a capacitor arranged to provide capacitance between the first helical winding segment and the second helical winding segment;

wherein the resonant trap circuit has a frequency dependent resistance;

wherein the helical winding portion includes an axis of symmetry that extends longitudinally within the helical winding portion equidistant from the first and second helical winding segments;

and wherein the helical winding portion can be bent along the axis of symmetry without substantially changing a frequency attenuation response of the resonant trap circuit;

wherein the conductor line includes a includes a coaxial cable that includes an outer conductor an inner conductor and a dielectric material therebetween;

wherein the capacitor includes at least one external capacitor coupled between a portion of the outer conductor at the first helical winding segment and a portion of the outer conductor at the second helical winding segment.

62. A resonant trap circuit comprising:

a conductor line arranged to include a helical winding portion that includes a first helical winding segment and a second helical winding segment that are helically twisted together; and a capacitor arranged to provide capacitance between the first helical winding segment and the second helical winding segment;

wherein the resonant trap circuit has a frequency dependent resistance;

wherein the helical winding portion includes an axis of symmetry that extends longitudinally within the helical winding portion equidistant from the first and second helical winding segments; and wherein the helical winding portion can be bent along the axis of symmetry without substantially changing a frequency attenuation response of the resonant trap circuit;

wherein the capacitor includes at least one external capacitor coupled between the first helical winding segment and the second helical winding segment;

wherein the conductor line includes a transmission line that includes at least two conductors separated by a dielectric;

wherein the transmission line includes a differential line and a ground shield; and wherein at least one capacitor is coupled between a portion of the ground shield at the first helical winding segment and a portion of the ground shield at the second helical winding segment.

63. A resonant trap circuit comprising:

a conductor line arranged to include a helical winding portion that includes a first helical winding segment and a second helical winding segment that are helically twisted together; and a capacitor arranged to provide capacitance between the first helical winding segment and the second helical winding segment;

wherein the resonant trap circuit has a frequency dependent resistance; wherein the helical winding portion includes an axis of symmetry that extends longitudinally within the helical winding portion equidistant from the first and second helical winding segments; and wherein the helical winding portion can be bent along the axis of symmetry without substantially changing a frequency attenuation response of the resonant trap circuit;

wherein the conductor line includes a includes a coaxial cable that includes an outer conductor an inner conductor and a dielectric material therebetween; and wherein the capacitor includes a distributed capacitance supplied by one of two or more shields of the coaxial cable.

64. A resonant trap circuit comprising:

a conductor line arranged to include a helical winding portion that includes a first helical winding segment and a second helical winding segment that are helically twisted together; and a capacitor arranged to provide capacitance between the first helical winding segment and the second helical winding segment;

wherein the resonant trap circuit has a frequency dependent resistance;

wherein the helical winding portion includes an axis of symmetry that extends longitudinally within the helical winding portion equidistant from the first and second helical winding segments; and wherein the helical winding portion can be bent along the axis of symmetry without substantially changing a frequency attenuation response of the resonant trap circuit;

wherein the capacitor includes at least one external capacitor coupled between the first helical winding segment and the second helical winding segment;

wherein the at least one external capacitor includes a dielectric layer including first and second conductor layers on opposite sides thereof, arranged with the first conductor layer mechanically and/or electrically contacting the first helical winding segment and with the second helical winding segment mechanically and/or electrically contacting the second helical winding segment.

65. The resonant trap circuit of claim 64, wherein the dielectric layer includes a flexible dielectric material.

66. A resonant trap circuit comprising:
a conductor line arranged to include a helical winding portion that includes a first helical winding segment and a second helical winding segment that are helically twisted together; and
capacitor arranged to provide capacitance between the first helical winding segment and the second helical winding segment;
wherein the conductor line includes a multi-layer printed circuit;
wherein the resonant trap circuit has a frequency dependent resistance;
wherein the helical winding portion includes an axis of symmetry that extends longitudinally within the helical winding portion equidistant from the first and second helical winding segments; and
wherein the helical winding portion can be bent along the axis of symmetry without substantially changing a frequency attenuation response of the resonant trap circuit;
wherein the multi-layer printed circuit includes a layered dielectric substrate and a conductor trace coupled to signal and ground conductors, located at different layers within the layered dielectric substrate;
wherein the signal and ground conductor lines both follow a parallel helical path within the substrate.

67. The resonant trap circuit of claim 66 further including:
a rigid or flexible layered dielectric substrate;
wherein the conductor line includes first and second ground conductors that are located at different layers within the substrate and that follow helical paths within the substrate; and
wherein the conductor line further includes a signal conductor located between the first and second ground conductors within the substrate and that follows a helical path within the substrate.

68. A receive circuit for use in a magnetic resonance imaging system comprising:
a receive coil;
a transmission line coupled to the receive coil; and
a first resonant trap circuit that includes:
a first portion of the transmission line arranged to include a first helical winding portion that includes a first helical winding segment and a second helical winding segment that are helically twisted together; and
a first capacitor arranged to provide capacitance between the first helical winding segment and the second helical winding segment;
wherein the first resonant trap circuit has a frequency dependent resistance;
wherein the helical winding portion includes an axis of symmetry that extends longitudinally within the helical winding portion equidistant from the first and second helical winding segments; and
wherein the helical winding portion can be bent along the axis of symmetry without substantially changing a frequency attenuation response of the first resonant trap circuit.

69. The receive circuit of claim 68, wherein the first capacitor includes a self-capacitance across the first helical winding portion.

70. The receive circuit of claim 68, wherein the first capacitor includes at least one external capacitor coupled across the first helical winding portion.

71. The receive circuit of claim 68 further including:
a second resonant trap circuit that includes:
a second portion of the transmission line arranged to include a second helical winding portion that includes a first helical winding segment and a second helical winding segment that are helically twisted together; and
a second capacitor arranged to provide capacitance between the first helical winding segment of the second helical winding portion and the second helical winding segment of the second helical winding portion;
wherein the second resonant trap circuit has a frequency dependent resistance;
wherein the helical winding portion of the second resonant trap circuit includes an axis of symmetry that extends longitudinally within the helical winding portion of the second resonant trap circuit equidistant from the first and second helical winding segments of the second resonant trap circuit and
wherein the helical winding portion of the second resonant trap circuit can be bent along the axis of symmetry of the second resonant trap circuit without substantially changing the frequency attenuation response of the second resonant trap circuit.

72. The receive circuit of claim 71, wherein the respective first and second resonant trap circuits have a matching frequency attenuation;
wherein the respective first and second resonant trap circuits are spaced apart from one another by no more than one quarter wavelength of the resonant frequency.

73. The receive circuit of claim 71, wherein the respective first and second resonant trap circuits attenuate different frequencies.

74. The receive circuit of claim 71, wherein the respective first and second resonant trap circuits are located side-by-side.

75. The receive circuit of claim 71, wherein at least one of the respective first and second resonant trap circuits is folded at least one hundred and eighty degrees.

76. The receive circuit of claim 68, wherein the receive coil is formed of a flexible material.

77. The receive circuit of claim 68 further including:
a second receive coil;
a second transmission line coupled to the second receive coil; and
a second resonant trap circuit that includes:
a portion of the second transmission line arranged to include a second helical winding portion that includes a first helical winding segment and a second helical winding segment that are helically twisted together; and
a second capacitor arranged to provide capacitance between the first helical winding segment of the second helical winding portion and the second helical winding segment of the second helical winding portion;
wherein the second resonant trap circuit has a frequency dependent resistance;
wherein the helical winding portion of the second resonant trap circuit includes an axis of symmetry that extends longitudinally within the helical winding portion of the second resonant trap circuit equidistant from the first and second helical winding segments of the second resonant trap circuit; and wherein the helical winding portion of the second resonant trap circuit can be bent along the axis of symmetry of the second resonant trap circuit without substantially changing the frequency attenuation response of the second resonant trap circuit.

78. A receive circuit array pad for use in a magnetic resonance imaging system comprising:
   a plurality of receive coils arranged so that each receive coil overlays at least a portion of another receive coil;
   a plurality of transmission lines each coupled to a different receive coil; and
   wherein each respective transmission line is arranged to provide a respective first resonant trap circuit that includes:
   a respective first portion of the respective transmission line arranged to include a respective first helical winding portion; and
   a respective first capacitor arranged to provide capacitance across a portion of the respective first helical winding portion;
   wherein each respective transmission line is arranged to provide a respective second resonant trap circuit that includes:
   a respective second portion of the transmission line arranged to include a respective second helical winding portion; and
   a respective second capacitor arranged to provide capacitance across a portion of the respective second helical winding portion.

79. The receive circuit array pad of claim 78,
   wherein respective first capacitors include self-capacitance across respective first helical winding portions.

80. The receive circuit array pad of claim 78,
   wherein respective first capacitors include respective at least one external capacitor coupled across respective first helical winding portions.

81. The receive circuit array pad of claim 78,
   wherein respective first and second resonant trap circuits formed by a respective transmission line each attenuate a different frequency;
   wherein respective first and second resonant trap circuits formed by a respective transmission line are spaced apart from one another by no more than one quarter wavelength of the resonant frequency.

82. The receive circuit array pad of claim 78,
   wherein the receive coils are formed of a flexible material.

83. The receive circuit array pad of claim 79 further including:
   a housing enclosing the plurality of receive coils, formed of a flexible material.

84. A method to produce a resonant trap circuit comprising:
   twisting a portion of a transmission line to form a helical winding portion that includes a first helical winding segment and a second helical winding segment that are helically twisted together and that includes a folded portion at a junction of the first helical winding segment and the second helical winding segment; and
   coupling at least one capacitor between the first helical winding segment and the second helical winding segment;
   wherein the transmission line includes a differential line and a ground shield; and
   wherein coupling includes coupling the capacitor between respective ground shield portions of the transmission line at the respective first and second helical winding segments.

85. A method to produce a resonant trap circuit comprising:
   twisting a portion of a transmission line to form a helical winding portion that includes a first helical winding segment and a second helical winding segment that are helically twisted together and that includes a folded portion at a junction of the first helical winding segment and the second helical winding segment; and
   coupling capacitive element between the first helical winding segment and the second helical winding segment;
   wherein the coupled capacitive element includes a flexible dielectric sheet covered on two sides by a flexible conductive coating;
   wherein the flexible dielectric sheet on the coupled capacitive element is wrapped in a scroll-like fashion around the helical twist of the transmission line such that a profile of the circuit is reduced without shorting the capacitive element.

86. The method of claim 85
   wherein tightening or loosening the scroll-like wrap of the capacitive element adjusts a second order inductance and capacitance of the capacitive element.

87. A method to produce a resonant trap circuit comprising:
   twisting a portion of a transmission line to form a helical winding portion that includes a first helical winding segment and a second helical winding segment that are helically twisted together and that includes a folded portion at a junction of the first helical winding segment and the second helical winding segment; and
   coupling at least one capacitor between the first helical winding segment and the second helical winding segment; and
   adjusting inductance of the helical winding.

88. The method of claim 87,
   wherein adjusting inductance of the helical winding includes adjusting an amount of conductor at the folded portion.

89. The method of claim 87,
   wherein adjusting inductance of the helical winding includes adjusting radius of the helical winding portion.

90. The method of claim 87,
   wherein adjusting inductance of the helical winding includes adjusting an amount of conductive shield around the helical winding.

91. The method of claim 87,
   wherein adjusting inductance of the helical winding includes adjusting a position where the capacitor is coupled to the helical winding.

92. A method to produce a resonant trap circuit comprising:
   twisting a portion of a transmission line to form a helical winding portion that includes a first helical winding segment and a second helical winding segment that are helically twisted together and that includes a folded portion at a junction of the first helical winding segment and the second helical winding segment; and
   coupling at least one capacitor between the first helical winding segment and the second helical winding segment; and
   placing a flexible cover about the helical winding.

93. A method to produce a resonant trap circuit comprising:
- twisting a portion of a transmission line to form a helical winding portion that includes a first helical winding segment and a second helical winding segment that are helically twisted together and that includes a folded portion at a junction of the first helical winding segment and the second helical winding segment; and
- coupling at least one capacitor between the first helical winding segment and the second helical winding segment;
- wherein a length of transmission line is laced through the helical winding portion, forming an additional leg of the helical winding portion.

94. The method of claim 93,
- wherein the transmission line forming the additional leg of the helix is electrically continuous with the transmission line forming one of the first two legs of the helical winding.

95. The method of claim 93,
- wherein a transmission line is added to a helical winding containing more than two portions.

96. The method of claim 93,
- wherein a capacitor is coupled between a ground shield of an additional leg of the one or more of the helical winding segments.

97. A receive circuit for use in a magnetic resonance imaging system comprising:
- a receive coil;
- a transmission line coupled to the receive coil; and
- a first resonant trap circuit that includes:
- a first portion of the transmission line arranged to include a first helical winding portion that includes a first helical winding segment and a second helical winding segment that are helically twisted together, and to include a folded portion at a junction between the first helical winding segment and the second helical winding segment; and
- a first capacitor arranged to provide capacitance between the first helical winding segment and the second helical winding segment;
- wherein the first helical winding segment includes a first base portion and extends between the first base portion and the folded portion;
- wherein the second helical winding segment includes a second base portion and extends between the second base portion and the folded portion;
- wherein the first and second helical winding segments are helically wound to include respective inner-facing surfaces that face toward one another, such that a shortest current flow path between the first base portion and the second base portion is along an inner-facing surface of the first helical winding segment, along an inner-facing surface of the second helical winding segment, and across the folded portion;
- wherein the helical winding portion includes an axis of symmetry that extends longitudinally within the helical winding portion, between the inner-facing surfaces of the respective first and second helical winding segments that face toward one another, equidistant from the first and second helical winding segments.

98. The receive circuit of claim 97,
- wherein the first capacitor includes a self-capacitance across the first helical winding portion.

99. The receive circuit of claim 97,
- wherein the first capacitor includes at least one external capacitor coupled across the first helical winding portion.

100. The receive circuit of claim 97 further including:
- a second resonant trap circuit that includes:
- a second portion of the transmission line arranged to include a second helical winding portion that includes a first helical winding segment and a second helical winding segment that are helically twisted together, and to include a second folded portion at a junction between the first helical winding segment of the second helical winding portion and the second helical winding segment of the second helical winding portion; and
- a second capacitor arranged to provide capacitance between the first helical winding segment of the second helical winding portion and the second helical winding segment of the second helical winding portion
- wherein the first helical winding segment of the second helical winding portion includes a first base portion and extends between the first base portion of the second helical winding portion and the second folded portion;
- wherein the second helical winding segment of the second helical winding portion includes a second base portion and extends between the second base portion of the second helical winding portion and the second folded portion;
- wherein the first and second helical winding segments of the second helical winding portion are helically wound to include respective inner-facing surfaces that face toward one another, such that a shortest current flow path between the first base portion of the second helical winding portion and the second base portion of the second helical winding portion is along an inner-facing surface of the first helical winding segment of the second helical winding portion, along an inner-facing surface of the second helical winding segment of the second helical winding portion, and across the second folded portion of the second helical winding portion;
- wherein the second helical winding portion includes an axis of symmetry that extends longitudinally within the second helical winding portion, between the inner-facing surfaces of the respective first and second helical winding segments of the second helical winding portion that face toward one another, equidistant from the first and second helical winding segments of the second helical winding portion.

101. The receive circuit of claim 100,
- wherein the respective first and second resonant trap circuits have a matching frequency attenuation;
- wherein the respective first and second resonant trap circuits are spaced apart from one another by no more than one quarter wavelength of the resonant frequency.

102. The receive circuit of claim 100,
- wherein the respective first and the second resonant trap circuits attenuate different frequencies.

103. The receive circuit of claim 100,
- wherein the respective first and second resonant trap circuits are located side-by-side.

104. The receive circuit of claim 100,
- wherein at least one of the respective first and second resonant trap circuits is folded at least one hundred and eighty degrees.

105. The receive circuit of claim 97,
- wherein the receive coil is formed of a flexible material.

106. The receive circuit of claim 97, a second receive coil;

a second transmission line coupled to the second receive coil; and a second resonant trap circuit that includes:

a portion of the second transmission line arranged to include a second helical winding portion that includes a first helical winding segment and a second helical winding segment that are helically twisted together, and to include a second folded portion at a junction between the first helical winding segment of the second helical winding portion and the second helical winding segment of the second helical winding portion; and a second capacitor arranged to provide capacitance between the first helical winding segment and the second helical winding segment the second helical winding portion wherein the first helical winding segment of the second helical winding portion includes a first base portion and extends between the first base portion of the second helical winding segment and the second folded portion;

wherein the second helical winding segment of the second helical winding portion includes a second base portion and extends between the second base portion of the second helical winding segment and the second folded portion;

wherein the first and second helical winding segments of the second helical winding portion are helically wound to include respective inner-facing surfaces that face toward one another, such that a shortest current flow path between the first base portion of the second helical winding segment and the second base portion of the second helical winding segment is along an inner-facing surface of the first helical winding segment of the second helical winding portion, along an inner-facing surface of the second helical winding segment of the second helical winding portion, and across the second folded portion of the second helical winding portion;

wherein the second helical winding portion includes an axis of symmetry that extends longitudinally within the second helical winding portion, between the inner-facing surfaces of the respective first and second helical winding segments of the second helical winding portion that face toward one another, equidistant from the first and second helical winding segments of the second helical winding portion.

\* \* \* \* \*